(12) United States Patent
Nazarian et al.

(10) Patent No.: US 6,243,664 B1
(45) Date of Patent: *Jun. 5, 2001

(54) METHODS FOR MAXIMIZING ROUTABILITY IN A PROGRAMMABLE INTERCONNECT MATRIX HAVING LESS THAN FULL CONNECTABILITY

(75) Inventors: Hagop A. Nazarian, San Jose; Stephen M. Douglass; W. Alfred Graf, both of Saratoga; S. Babar Raza, Sunnyvale; Sundar Rajan, Mountain View; Shiva Sorooshian Borzin, Fremont; Darren Neuman, San Jose, all of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/181,084

(22) Filed: Oct. 27, 1998

(51) Int. Cl.[7] ............................ G06F 15/173; G06F 17/16
(52) U.S. Cl. ................................ 703/14; 703/2; 716/12; 340/825.83; 307/112; 326/41
(58) Field of Search ................................ 703/14, 13, 2; 716/12; 307/112, 115; 340/825.79, 825.83, 825.85, 825.89; 370/380, 386; 326/37, 38, 39, 41

(56) References Cited

U.S. PATENT DOCUMENTS

| | | | |
|---|---|---|---|
| Re. 34,363 | 8/1993 | Freeman | 307/465 |
| 4,847,612 | 7/1989 | Kaplinsky | 340/825.8 |
| 4,871,930 | 10/1989 | Wong et al. | 326/39 |
| 4,873,459 | 10/1989 | El Gamal et al. | 326/41 |
| 4,912,342 | 3/1990 | Wong et al. | 326/40 |
| 4,989,022 | 1/1991 | Hwang et al. | 340/825.8 |
| 5,015,884 | 5/1991 | Agrawal et al. | 326/39 |
| 5,079,451 | 1/1992 | Gudger et al. | 326/41 |
| 5,153,463 | 10/1992 | Keiichi | 326/41 |
| 5,175,539 | 12/1992 | Richter | 340/825.8 |
| 5,204,556 | 4/1993 | Shankar | 326/41 |
| 5,229,990 | 7/1993 | Teraslinna | 370/218 |
| 5,241,224 | 8/1993 | Pedersen et al. | 326/41 |
| 5,251,147 | 10/1993 | Finnerty | 716/6 |
| 5,260,611 | 11/1993 | Cliff et al. | 326/39 |
| 5,268,598 | 12/1993 | Pedersen et al. | 326/39 |
| 5,341,044 | 8/1994 | Ahanin et al. | 326/41 |
| 5,359,537 | 10/1994 | Saucier et al. | 716/18 |
| 5,367,518 | 11/1994 | Newman | 370/414 |
| 5,371,422 | 12/1994 | Patel et al. | 326/41 |

(List continued on next page.)

*Primary Examiner*—Kevin J. Teska
*Assistant Examiner*—Russell W. Frejd
(74) *Attorney, Agent, or Firm*—Wagner, Murabito & Hao LLP

(57) ABSTRACT

Methods for designing a programmable interconnect matrix having reduced connectivity to achieve maximum routability for the reduced connectivity. An array of multiplexors, each having a multiplexor width $w_{mux}$ that is less than number of input conductors for the programmable matrix, are coupled to the input conductors of the programmable interconnect matrix such that the number of input signals shared between any two multiplexors is less than the multiplexor width $w_{mux}$ and such that each input signal has approximately the same number of chances to route. To better ensure the successful routing of input signals by a programmable interconnect matrix designed according to the present methods, improved routing methods are also described. According to a first embodiment, routing is accomplished by swapping successfully routed input signals with a blocked input signal and determining whether the input signal that has been swapped out may be routed through available multiplexors. According to a second embodiment, a predictive swapping technique is used whereby successfully routed signals qualified to provide a blocked signal with a route are first checked to determine whether a successful routing will be provided before swapping in the blocked output signal.

19 Claims, 40 Drawing Sheets

U.S. PATENT DOCUMENTS

| | | | |
|---|---|---|---|
| 5,371,495 | 12/1994 | Sturges et al. | 340/825.79 |
| 5,376,844 | 12/1994 | Pedersen et al. | 326/41 |
| 5,384,499 | 1/1995 | Pedersen et al. | 326/39 |
| 5,394,033 | 2/1995 | Tsui et al. | 326/41 |
| 5,396,126 | 3/1995 | Britton et al. | 326/41 |
| 5,426,674 | 6/1995 | Nemirovsky et al. | 709/241 |
| 5,436,514 | 7/1995 | Agrawal et al. | 326/41 |
| 5,436,576 | 7/1995 | Hibdon et al. | 326/47 |
| 5,444,394 | 8/1995 | Watson et al. | 326/45 |
| 5,457,410 | 10/1995 | Ting | 326/41 |
| 5,463,328 | 10/1995 | Cope et al. | 326/41 |
| 5,473,266 | 12/1995 | Ahanin et al. | 326/41 |
| 5,486,775 | 1/1996 | Veenstra | 326/38 |
| 5,521,529 | 5/1996 | Agrawal et al. | 326/41 |
| 5,557,217 | 9/1996 | Pedersen | 326/39 |
| 5,557,533 | 9/1996 | Koford et al. | 716/9 |
| 5,596,742 | 1/1997 | Agarwal et al. | 716/16 |
| 5,617,042 | 4/1997 | Agrawal | 326/39 |
| 5,621,650 | 4/1997 | Agrawal et al. | 716/16 |
| 5,640,327 | 6/1997 | Ting | 716/7 |
| 5,657,241 | 8/1997 | Butts et al. | 716/16 |
| 5,668,771 | 9/1997 | Cliff et al. | 365/230.03 |
| 5,682,107 | 10/1997 | Tavana et al. | 326/41 |
| 5,689,686 | 11/1997 | Nazarian et al. | 716/12 |
| 5,848,066 * | 12/1998 | Nazarian et al. | 370/380 |
| 5,923,868 * | 7/1999 | Nazarian et al. | 703/21 |

\* cited by examiner

US 6,243,664 B1

METHODS FOR MAXIMIZING ROUTABILITY IN A PROGRAMMABLE INTERCONNECT MATRIX HAVING LESS THAN FULL CONNECTABILITY

FIELD OF THE INVENTION

The present invention relates to programmable logic devices and more particularly to providing maximum routability of input signals in a programmable interconnect matrix having less than full connectability.

BACKGROUND OF THE INVENTION

Various programmable logic architectures are known, including, for example, the programmable logic device ("PLD"), the programmable logic array ("PLA"), and programmable array logic ("PAL™"). Wherein there are many differences between the various architectures, each of the PLD, PLA, and PAL architectures typically includes a set of input conductors directly coupled as inputs to an array of logical AND gates ("product term array"), the outputs of which, in turn, act as inputs to another portion of the logic device.

The product term array is often fully programmable, which typically results in 1) each logical AND gate of the product term array having as many inputs as there are input conductors, 2) an array of programmable switches or elements that allow a programmer to selectively enable and disable the use of each input conductor as an input term for each logical AND gate, and 3) a multiplicity of conductors each of which is routed from one programmable element to one input of a logical AND gate. The total number of programmable elements is typically equal to the number of input conductors multiplied by the number of logical AND gates, and each input conductor is capable of being connected to each logical AND gate. A fully programmable product term array has "full connectability" because each input condutor of the product term array can be coupled to each logical AND gate of the product term array.

For complex programmable logic devices ("CPLDs"), wherein the set of input conductors and the set of logical AND gates to which they connect are both quite large compared to prior PLDs, PALs™, and PLAs, maintaining the full connectability of the product term array for each input conductor becomes impractical. First, to maintain full connectability, the size of the input field of each logical AND gate in the product term array must increase for each input conductor that is added. Second, the addition of a single input conductor requires the addition of a number of programmable elements equal to the total number of logical AND gates, one for each logical AND gate. Third, the total number of conductors that are routed from the programmable elements to the AND gates increases as the number of programmable elements increases. All of these consequences of attempting to maintain full connectability for CPLDs result in a large increase in die space for the product term array without a proportionate increase in functionality over the less complex PLD.

One solution is to interpose a connection circuit that is not fully connectable between the set of input conductors and the product term array of a logic block, wherein the inputs of the connection circuit are coupled to the input conductors of the CPLD and the outputs of the connection circuit are coupled to the inputs of the product term array of a logic block. One such connection circuit is associated with each CPLD logic block and provides unique connection between CPLD inputs and the product term array inputs of the associated logic block. Typically, this connection circuit allows only a subset of the CPLD inputs to be connected to the product term array inputs.

Early CPLDs implement this connection circuit as a programmable, fully populated cross-point matrix similar to that used in a fully programmable product term array. Each input conductor of the connection circuit is connected to a number of programmable elements equal to the number of output conductors of the connection circuit, wherein each programmable element is capable of providing a unique connection between the input conductor and one of the output conductors. This connection circuit guarantees a route for every possible combination of input signals up to the total number of output conductors of the front end connection, regardless of the ordering of the combination. A fully populated cross-point matrix may thus be said to have "full connectability," wherein the term "connectability" denotes the ability of the connection circuit to connect an input conductor of the connection circuit to the output conductors of the connection circuit. A "fully connectable" connection circuit is one that can connect every input conductor to every output conductor.

This early approach is very inefficient. First, the number of programmable elements required for each connection circuit is equal to the total number of CPLD input conductors, $n_{in}$, multiplied by the number of output conductors, $n_{out}$, for the connection circuit, wherein $n_{out}$ is typically equal to the number of input terms for the product term array of the associated logic block. As a CPLD typically implements two or more connection circuits, this approach requires large amounts of die area.

Second, of the $n_{in}$ programmable elements connected to any one of the $n_{out}$ output conductors, only one of the programmable elements is ever programmed, regardless of the input signals selected for routing through the connection circuit. Otherwise, two or more input signals may be shorted together. Thus, the maximum number of programmable elements that are ever used to route any combination of input signals through a fully populated cross-point matrix is $n_{out}$. This means that the maximum percentage of programmable elements that are used for any one connection circuit is equal to $(1/n_{in})$. Therefore, the amount of die space required to implement the fully connectable cross-point matrix is excessive in light of underutilization of the programmable elements. The inefficiency of this early approach is only emphasized when the number $n_{in}$ of CPLD inputs increases.

An alternative connection circuit provides full connectability while requiring less "connectivity" than the fully populated cross-point matrix. The term "connectivity" refers to the total number of programmable elements provided by a connection circuit. This alternative connection circuit uses a number $n_{out}$ of $n_{in}$:1 multiplexors, wherein the output of each multiplexor is connected to an output conductor of the connection circuit. As each multiplexor requires only (log $n_{in}$/log2) programmable elements, the total number of programmable elements (the connectivity) for a fully connectable multiplexor array is reduced to $n_{out}$ multiplied by (log $n_{in}$/log2). Wherein this results in some savings of die space over the fully connectable cross-point matrix, the die space requirements are still excessive, especially when the number $n_{out}$ of CPLD input signals increases.

To further reduce the amount of semiconductor die area needed for a connection circuit, the connectivity of the connection circuit may be further reduced by providing even fewer programmable elements. This reduction in connectivity results in connection circuits that are not fully connectable, which means that every input conductor of the connection circuit cannot be connected to every output conductor of the connection circuit. The level of connectability for a connection circuit is related to the level of "routability" of the connection circuit. For purposes of discussion, the term "routability" denotes the probability that the connection circuit can provide a route for any given combination of input signals from the input conductors to the output conductors of the connection circuit. The routability of a connection circuit tends to increase with the connectability of the connection circuit.

Because every input conductor can no longer be connected to every output conductor, the number of "routes" through the connection circuit for a particular combination of input signals may be reduced when compared to fully connectable connection circuits. So long as a connection circuit provides at least one route for every combination of n input signals, the connection circuit is "fully routable" or "100% routable." If no route can be provided for a particular combination of input signals, the connection circuit is not fully routable. Fully connectable connection circuits have "maximum" routability as they provide a route for every permutation of $n_{out}$ input signals.

Connectivity for a multiplexor array is reduced by reducing the width of the input field for each multiplexor such that the number of input conductors that are coupled to each multiplexor is less than the total number $n_{in}$ of input conductors for the connection circuit. So long as each input signal is provided with at least one chance to route, i.e., each input conductor is connected to at least one multiplexor, a successful routing for a particular logic function can be achieved regardless of the routability of the connection circuit. For such a constrained multiplexor, providing a route for a particular logic function may require a carefully chosen pin assignment for the CPLD such that the desired combination of input signals are connected to input conductors that have a route through the connection circuit to the output conductors. If the particular logic function is changed at a later time, the same pin assignment may not be able to provide a route for the selected combination of input signals for the altered logic function. This can have disastrous consequences for a system designer which has already manufactured volume quantities of printed circuit boards based on the prior pin assignment.

To better ensure that pin assignments do not have to be altered when a logic function is altered, the routability of the connection circuit should be maximized. As described above, a greater level of connectability for a connection circuit tends to result in a greater level of routability for that connection circuit. However, a greater level of connectability requires a greater level of connectivity, and more die area is consumed, which typically results in higher device cost and slower device speeds. The challenge is to find the optimum balance point between the connectivity, connectability, and routability of a connection circuit.

SUMMARY AND OBJECTS OF THE INVENTION

Therefore, it is desirable to provide a method for designing a connection circuit having a maximum level of routability and connectability for a given level of connectivity.

It is also desirable to provide high routability for a programmable interconnection matrix such that pin-for-pin compatibility between revisions may be better maintained.

It is also desirable to provide improved routing methods for routing a combination of input signals through a programmable interconnect matrix having reduced connectivity.

According to a first embodiment, a method for designing a programmable interconnect matrix comprises the steps of providing a plurality $n_{in}$ of input conductors, providing a plurality $n_{out}$ of output conductors, and providing a plurality $n_{mux}$ of multiplexors, wherein a width $w_{mux}$ of each multiplexor is less than $n_{in}$. Each input conductor is connected to r multiplexors such that each multiplexor shares input conductors with at least two other multiplexors, wherein r is equal to $$\frac{(n_{mux})(w_{mux})}{n_{in}}$$

and q is equal to $$\frac{(n_{mux})(w_{mux}) - (n_{in})}{n_{mux}}.$$

According to a second embodiment, a method for designing a programmable interconnect matrix comprises the steps of providing a plurality $n_{in}$ of input conductors, providing a plurality $n_{out}$ of output conductors, and providing a plurality $n_{mux}$ of multiplexors, wherein a width $w_{mux}$ of each multiplexor is less than $n_{in}$. Each of a subset m of the $n_{in}$ input conductors is connected to x of the $n_{mux}$ multiplexors, wherein x is equal to r rounded up to a nearest integer, r is not an integer and is equal $$\frac{(n_{mux})(w_{mux})}{n_{in}},$$

and m is equal to $((n_{in})(x)-(n_{out})(w_{mux}))$. Each of the remaining input conductors is connected to y of the $n_{mux}$ multiplexors, wherein y is equal to r rounded down to a nearest integer, the $n_{in}$ input conductors being coupled to the $n_{mux}$ multiplexors such that each multiplexor shares q input conductors with at least two other multiplexors, wherein q is equal to $$\frac{(n_{mux})(w_{mux}) - (n_{in})}{n_{mux}}.$$

According to a third embodiment, a method for designing a programmable interconnect matrix comprises the steps of providing a plurality $n_{in}$ of input conductors, providing a plurality $n_{out}$ of output conductors, and providing a plurality $n_{mux}$ of multiplexors, wherein a width $w_{mux}$ of each multiplexor is less than $n_{in}$. Each input conductor is connected to r multiplexors such that each multiplexor of a subset s of the $n_{mux}$ multiplexors shares v input conductors with at least one other multiplexor and each of $(n_{mux}-s)$ multiplexors share u input conductors with at least one other multiplexor, wherein r is equal to $$\frac{(n_{mux})(w_{mux})}{n_{in}},$$

u is equal to q rounded down to a nearest integer, v is equal to q rounded up to a nearest integer, q is not an integer and is equal to $$\frac{(n_{mux})(w_{mux}) - (n_{in})}{n_{mux}},$$

and s is equal to $((n_{mux})(v)-((n_{mux})(w_{mux})-n_{in}))$.

According to a fourth embodiment, a method for designing a programmable interconnect matrix comprises the steps of providing a plurality $n_{in}$ of input conductors, providing a plurality $n_{out}$ of output conductors, and providing a plurality $n_{mux}$ of multiplexors, wherein a width $w_{mux}$ of each multiplexor is less than $n_{in}$. Each of a subset m of the $n_{in}$ input conductors is connected to x of the $n_{mux}$ multiplexors, wherein x is equal to r rounded up to a nearest integer, r is not an integer and is equal $$\frac{(n_{mux})(w_{mux})}{n_{in}},$$

and m is equal to $((n_{in})(x)-(n_{out})(w_{mux}))$. Each of the remaining input conductors is connected to y of the $n_{mux}$ multiplexors, wherein y is equal to r rounded down to a nearest integer. The $n_{in}$ input conductors are coupled to the $n_{mux}$ multiplexors such that each multiplexor of a subset s of the $n_{mux}$ multiplexors shares v input conductors with at least one other multiplexor and each of $(n_{mux}-s)$ multiplexors share u input conductors with at least one other multiplexor, wherein u is equal to q rounded down to a nearest integer, v is equal to q rounded up to a nearest integer, q is not an integer and is equal to $$\frac{(n_{mux})(w_{mux}) - (n_{in})}{n_{mux}},$$

and s is equal to $((n_{mux})(v)-((n_{mux})(w_{mux})-n_{in}))$.

For each of the first four embodiments, the number of provided multiplexors $n_{mux}$ may be greater than the number of output conductors $n_{out}$, wherein a maximum of $n_{out}$ multiplexors are ever selected to connect input conductors to output conductors. Further, the multiplexor width $w_{mux}$ may be equal to $n_{in}-n_{mux}+1$, such that the programmable interconnect is fully routable.

To better provide routes through a programmable interconnect matrix designed according to the methods of the various embodiments, improved programming methods for programming a programmable interconnect matrix are also disclosed. A swapping programming method is disclosed in which a previously unavailable multiplexor that is capable of routing the blocked input signal is freed by removing the route for the capturing signal. The blocked input signal is then routed through the now available multiplexor, and the router attempts to reroute the capturing signal, which no longer has a route through the PIM. This process of replacing the capturing signal of a multiplexor with a blocked input signal is known as "swapping."

A predictive programming method is also disclosed. The predictive programming method implicitly divides the set of input signals into a number of different levels of signals that are qualified for rerouting to provide a route for a blocked input signal. The first level of qualified signals are the capturing input signals that are routed through the set of multiplexors that are otherwise capable of routing the blocked input signal. The second level of qualified signals are those input signals that compete with the capturing input signals and that are routed through multiplexors that are otherwise capable of routing the capturing input signals. The second level of qualified input signals are referred to as "competing signals." The next level of qualified signals are those input signals that compete with the competing signals and that are routed through multiplexors that are otherwise capable of routing the competing signals. Depending on the complexity of the PIM, there may be many more levels of qualified signals. Each successive level of qualified input signals are those input signals that are routed through a multiplexor that can otherwise route a signal from the previous level of qualified input signals.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
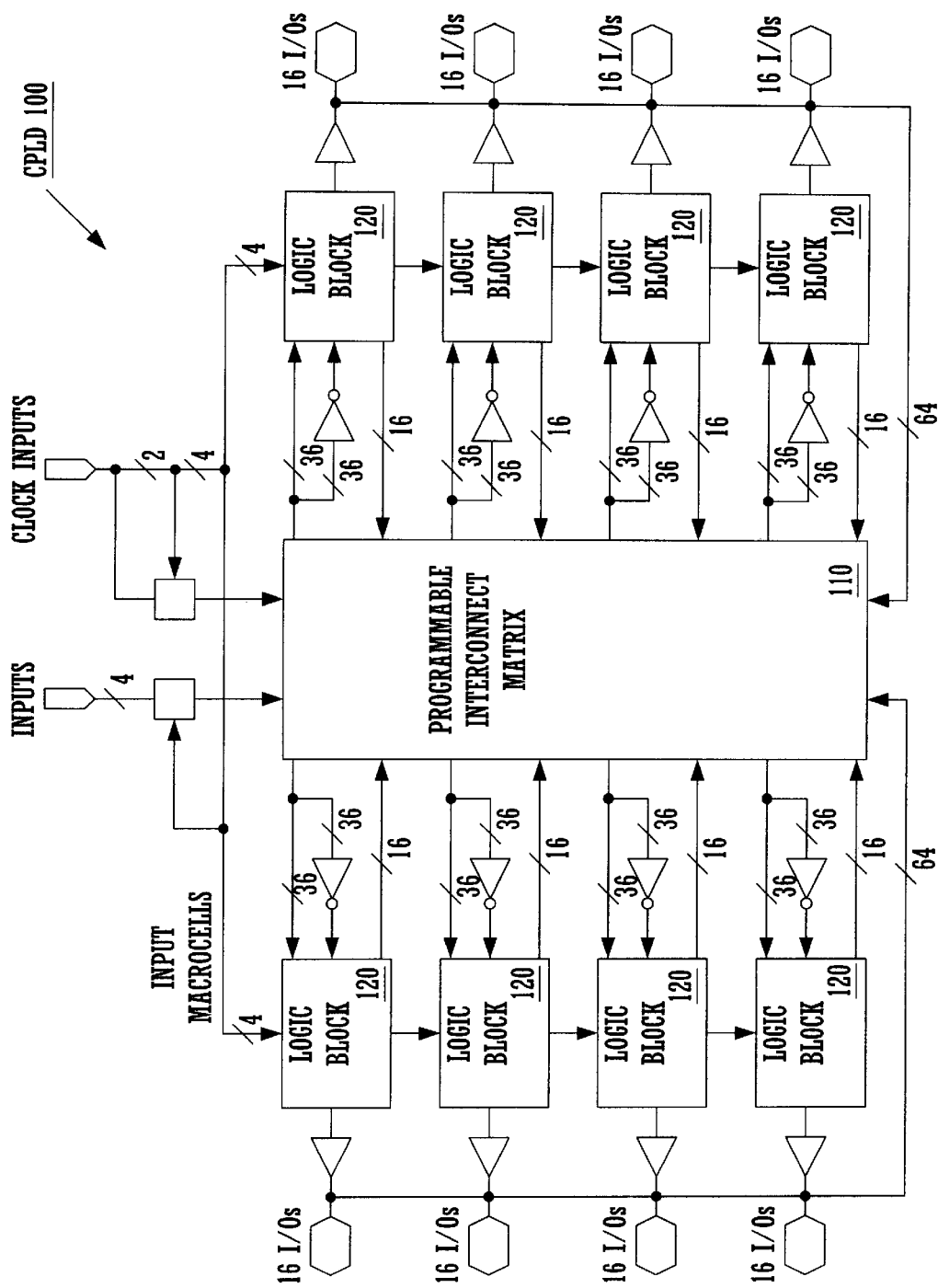
FIG. 1 shows a complex programmable logic device (CPLD) according to one embodiment.

The connectivity, connectability and routability of a connection circuit, hereinafter "programmable interconnect matrix" or "PIM," are, as stated above, characteristics of the PIM that are quite interrelated. Because the connectivity of the PIM directly affects the amount of die space required for the PIM, the connectivity of the PIM is more likely to be the characteristic that drives the design of the PIM.

Regardless of the level of connectivity chosen by the designer, the connectability of the PIM should be optimized to provide maximum routability for the desired level of connectivity. A purchaser of the PIM determines which input conductors of the PIM are connected to which output conductors of the PIM by programming the programmable elements of the PIM. Because the manufacturer cannot predict every use of the PIM, providing maximum routability for a given level of connectivity better ensures that the purchaser of the PIM will be able to successfully program the PIM.

The discussion of PIMs that follows assumes that the pin assignment for the associated CPLD remains fixed. In this manner, the routability of a PIM having a given level of connectability can be accurately assessed because, as described above, even a PIM that provides a maximum of one chance to route for each input signal is "fully routable" in the sense that the pin assignments of the CPLD can be altered to provide a route for any particular combination of input signals.

To reduce the die area required to implement a PIM, a basic assumption for any PIM design is that the connectivity of the PIM is such that the PIM is less than fully connectable. Thus, not every input conductor of the PIM can be connected to every output conductor of the PIM. Given this assumption, the first question is whether the PIM will also be less than fully routable. If a fully routable PIM is desired, the minimum level of connectivity is constrained, as described below. If full routability is not required, the level of connectivity is not Constrained, but the PIM design should be optimized such that maximum routability and connectability are provided for the given level of connectivity.

Through theoretical analysis and independent Monte Carlo simulation, the inventors have determined that full routability, i.e., a 100% probability of providing a route for any combination of input signals for a PIM, can be assured while simultaneously reducing the connectivity and connectability of the PIM. As discussed below, the connectivity of a PIM determines the average number of chances to route provided to each input signal, wherein the average number of chances to route is purely a function of the number of programmable elements, the number of input conductors, and the number of output conductors. The actual number of chances to route provided to an input conductor defines the connectability of that input conductor.

The inventors have determined that providing each input signal with the average number of chances to route, when possible, leads to improved connectability for a PIM of a given connectivity. This improved connectability, when combined with a particular method of arranging the multiplexors of a PIM discovered by the inventors, leads to the maximum routability for a PIM having the given connectivity. The inventors have also determined that the routability of a PIM is a highly non-linear function of the number of chances to route such that, at some point, increasing the connectivity to increase the average number of chances to route does not further increase the routability of the PIM.

The primary approach to designing a PIM is purely architectural and focuses on the physical structure of the PIM. It is the PIM architecture that ultimately determines the amount of die space required by the PIM, the level of connectability of the PIM, and the expected level of routability of the PIM. The actual level of routability, however, may differ from the expected level of routability for a PIM having the desired level of connectability, depending on the routing software, or "router," which is used to route signals through the PIM. Unlike fully connectable architectures, a PIM that can route every combination of input signals may not be able to route every permutation of a particular combination. Thus, an improved router may be needed to more intelligently select routes through the PIM.

FIG. 1 shows a complex programmable logic device ("CPLD") 100 which is implemented on a single semiconductor die. The CPLD 100 includes a PIM 110 and eight logic blocks 120. Wherein eight logic blocks 120 are shown, as few as two logic blocks may be used in the CPLD 100. The CPLD 100 has a total of 262 inputs, each of which is connected to the PIM 110. The PIM 110 is capable of providing each logic block 120 with its own set of input terms by independently selecting as many as thirty-six of the possible 262 input signals as input terms for each logic block 120. As shown, the complements for each of the thirty-six signals output by the PIM 110 are also provided to each logic block 120. Thus, each logic block receives as many as seventy-two input terms from the PIM 110.

The PIM 110 includes a number of programmable elements (not shown) for controlling an array of multiplexors (not shown) to reduce the total number of programmable elements required. The programmable elements may be volatile memory elements such as static random access memory (SRAM), non-volatile memory elements such as flash electrically erasable programmable read only memory ("flash EEPROM"), or fuses. Alternatively, the programmable elements of the PIM 110 may be implemented to control a matrix of cross-point switches; however, this increases the total number of programmable elements required to make the same number of connections. Whether the connections between input conductors and output conductors are provided by a cross-point Switch matrix or by an array of multiplexors, each output conductor can be connected to a maximum of one input conductor. Thus, both forms of connection perform a multiplexing function in the sense that both forms of connection provide for the selection of one input conductor from a set of many input conductors. Therefore, as used herein, the term "multiplexor" will be understood to encompass any circuit that performs a multiplexing function, regardless of the number of programmable elements required to control that circuit.

The 262 inputs to the PIM include 128 feedback signals, 128 input signals, and six dedicated input signals, which include four clock signals. Sixteen feedback signals and as many as sixteen input signals are provided by each logic block 120. Each logic block 120 is programmed to perform selected logic functions using subcombinations of the seventy-two input terms provided by the PIM 110. Each logic block 120 has sixteen input/output ("I/O") pins, which may be used either as inputs to the PIM 112 or outputs of the CPLD 100.

Conceptually, the CPLD 100 may be regarded as a PIM coupled in series with eight PLDs coupled in parallel, wherein each logic block 120 corresponds to a single PLD. Intermediate stages and the outputs of each of the eight PLDs are fed back as inputs to the PIM. Depending on the particular set of input signals routed to the outputs of the PIM and the programmed logic functions for each logic block 120, the eight PLDs may, in fact, act as two or more PLDs coupled in series with each other. The CPLD 100 thus provides a highly versatile logic device on a single semiconductor die.

Figure 2:
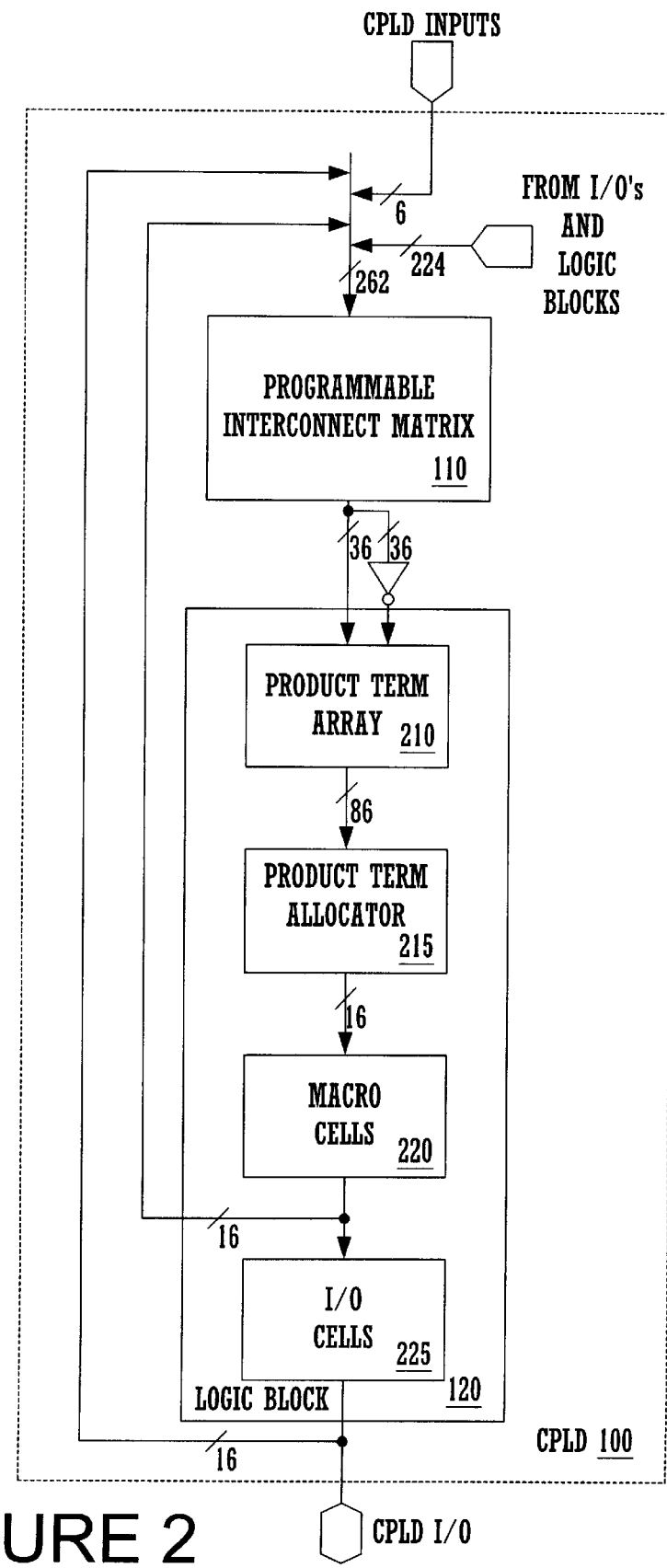
FIG. 2 shows the CPLD in more detail.

FIG. 2 shows portions of the CPLD 100 in greater detail. Specifically, a logic block 120 is shown as including a product term array 210, a product term allocator 215, macrocells 220, and I/O cells 225. The product term array for this embodiment is a fully programmable seventy-two by eighty-six AND array. The product term allocator 215 allocates product terms from the product term array 210 to sixteen macrocells 220. The product term allocator 215 "steers" product terms to macrocells as needed. For example, if one macrocell requires ten product terms while another requires only three product terms, the product term allocator 215 "steers" ten product terms to one macrocell and three product terms to the other macrocell. For this embodiment, from zero to sixteen product terms can be steered to any one macrocell.

The outputs for each of the sixteen macrocells 220 are fed back to the PIM 110 as input signals. The specific architecture of the macrocells 220 may be any appropriate architecture. The sixteen outputs of the macrocells 220 are also fed to sixteen I/O cells 225. Each of the sixteen I/O cells 225 includes a three-state output buffer. The user can program each I/O cell to change the way the three-state output buffer is enabled and/or disabled. The output signals of the sixteen I/O cells 225 are fed back as input signals to the PIM 110.

To provide a similar level of functionality without the use of the PIM 110, the product term array for each of the logic blocks 120 would need to be modified to accept the 262 inputs of the CPLD 100. As discussed previously, this would require a large increase in die space for the CPLD 100.

Hereinafter, the size of the PIMs described herein is limited to simplify the examples. It should be understood that the size of the PIM is not limited to that disclosed with respect to FIG. 1 nor to the size of the illustrative PIMs described in the examples below.

The number of inputs and the number of outputs possessed by the PIM determine the number of possible combinations of input signals that can be selected for output by the PIM. The level of routability of the PIM determines how many of the possible combinations can actually be routed by the PIM. To be fully routable, a PIM must provide a "route" to the outputs of the PIM for each possible combination of input signals. It is important to distinguish the concepts of "combination" and "route." As used herein, the term "route" refers to a number of connections that are made between the input and output conductors of the PIM such that a particular combination of input signals is successfully routed to the out conductors of the PIM.

Figure 3:
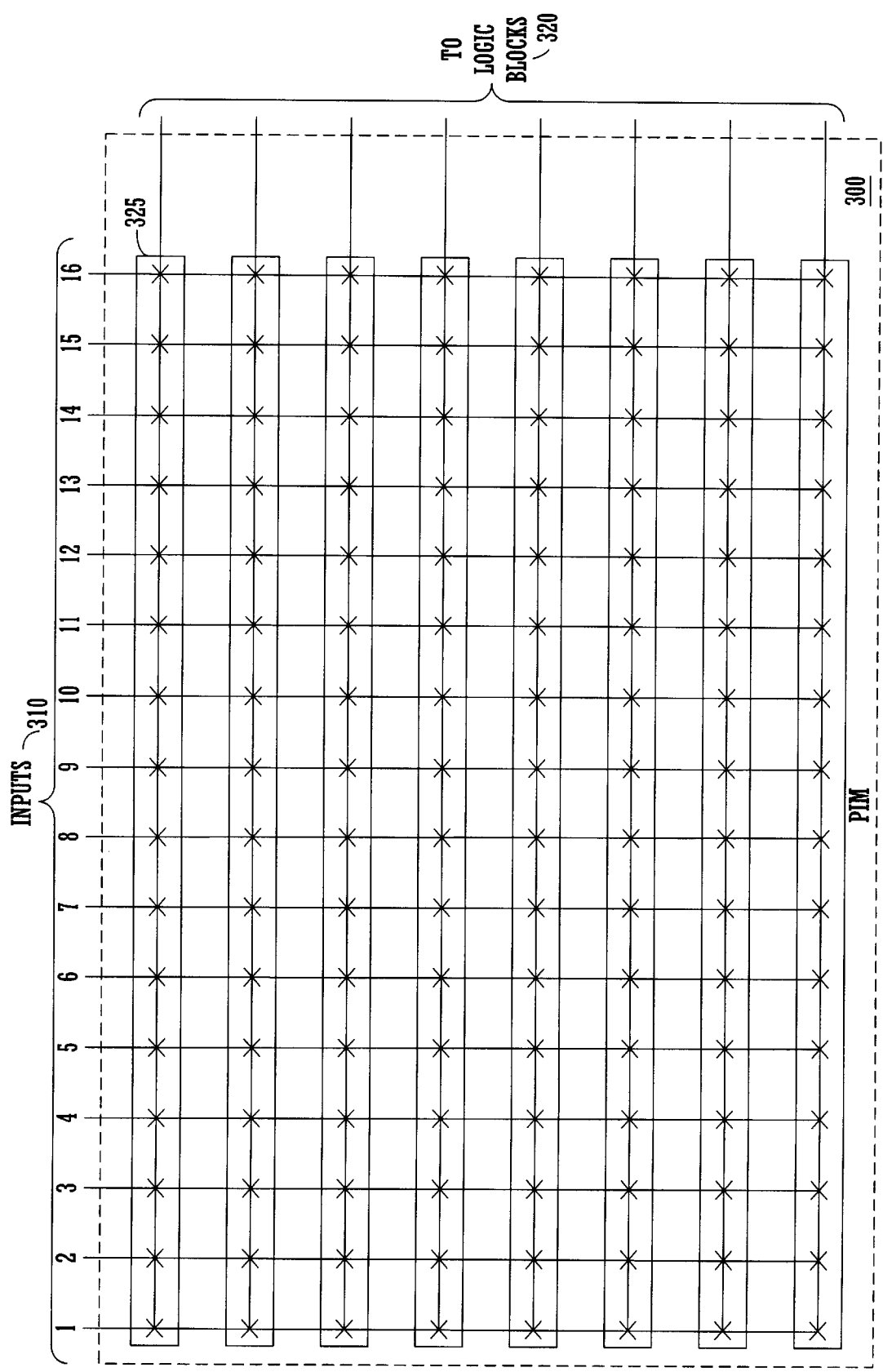
FIG. 3 shows a fully connectable programmable interconnect matrix (PIM).

A fully connectable PIM 300 is shown in FIG. 3. The illustrative PIM 300 includes sixteen input conductors 310 and eight output conductors 320. The input conductors 310 are shown as sixteen vertical lines, and the output conductors 320 are shown as eight horizontal lines. The input conductors 310 and the output conductors 320 intersect, forming a grid. The PIM 300 includes an array of eight 16:1 multiplexors 325. Thus, each input conductor 310 can be connected to any output conductor 320. Each multiplexor 325 is shown as a box that encompasses a number of intersections in the grid formed by the input conductors 310 and the output conductors 320. Each "X" within the box representing the multiplexors 325 indicates that the input conductor 310 and the output conductor 320 that intersect can be coupled to one another by the multiplexor 325. Wherein a single multiplexor may be represented using two or more boxes along a given horizontal line, the multiplexor is physically one unit.

Each multiplexor 325 has sixteen inputs wherein each input of each multiplexor 325 is coupled to a corresponding one of the sixteen inputs 310. The total number of multiplexors 325 is equal to the number of output conductors 320, and the output of each multiplexor 325 is coupled to a corresponding one of the eight output conductors 320. Each multiplexor 325 selects only one of the sixteen input conductors 320 for coupling to its output. As discussed below, there are certain cases when it may be desirable for the number of multiplexors to exceed the total number of output conductors for the PIM.

The number of possible combinations for a structure having a number of input signals, $n_{in}$, of which only a subset of input signals, $n_{out}$, are selected for output is defined by the following equation:

$$C(n_{in}, n_{out}) = \frac{n_{in}!}{n_{out}!(n_{in} - n_{out})!} \quad (1)$$

The PIM of FIG. 3 has sixteen input signals of which a maximum of eight input signals are output at any one time. Applying equation 1, the number of different combinations of input signals that can be selected for routing by the PIM of FIG. 3 is 12,870.

A fully connectable PIM is also fully routable because a connection can be made between any input conductor and any output conductor of the PIM. However, the connectivity of a fully connectable PIM defeats the goal to minimize the CPLD die space required to implement the PIM architecture. Wherein the fully connectable PIM 300 of FIG. 3 does not expressly provide details about how to achieve maximum routability given less than full connectability, there are a number of observations that can be made regarding the PIM architecture of the PIM 300 shown in FIG. 3 that will assist in designing a PIM having maximum routability for less than full connectability.

First, the width of each multiplexor, $w_{mux}$, is equal to the number of inputs, $n_{in}$. Second, each input signal provided by the input conductors 310 has a number of chances to route, $n_{ctr}$, equal to the number of output conductors 320. Because each input signal has the same number of chances to route, the architecture of the PIM 300 shown in FIG. 3 is said to have "uniform chances to route." Finally, each multiplexor 325 receives the same input signals as every other multiplexor 325. Thus, each input signal provided by the input conductors 310 "competes" for routing with the same input signals at each multiplexor 325. This aspect of the PIM architecture of FIG. 3 is called "full overlap."

Among the identified characteristics of multiplexor width, number of chances to route, and overlap, it is apparent that the multiplexor width, $w_{mux}$, has the largest and most direct impact on the connectivity of the PIM because reducing the multiplexor width reduces the number of programmable elements of the PIM. The effect of the multiplexor width on the connectability and routability of the PIM 300 is similar. As the connectivity of the PIM decreases, the average number of chances to route decreases, decreasing the connectability of the PIM.

As discussed above, the inventors have determined the minimum levels of connectivity and connectability required to achieve full routability for a PIM having a given number of input and output conductors. If full routability is desired, the minimum multiplexor width $w_{mux}$ for a given number of input and output conductors can be expressed by the following equation:

$$w_{mux}=n_{in}-n_{out}+1, \qquad (2)$$

wherein $n_{out}$ is equal to the total number of output conductors 320 for the PIM 300. Equation 2 assumes that the each multiplexor of the PIM has the same multiplexor width. If the PIM 300 is implemented as a cross-point switch matrix rather than as an array of multiplexors, the multiplexor width $w_{mux}$ indicates the number of cross-point switches that are connected to each output conductor 320. As the multiplexor width of the PIM decreases below the minimum multiplexor width given by equation 2, the maximum number of possible combinations of input signals that can be routed by the PIM decreases. A PIM can have multiplexors of different widths, but a uniform width is preferable to better ensure equal propagation delays for each multiplexor.

As discussed previously, the level of connectivity affects the level of connectability. The level of connectability of a PIM can be stated simply in terms of the number of chances to route provided to each input signal. For a fully connectable PIM, each input signal is provided with a number of chances to route equal to the number of output conductors for the PIM. For PIMs that are less than fully connectable, connectability is expressed in terms of the average number of chances to route provided to each input signal. The average number of chances to route, $n_{ctr}$, for a PIM that is not fully connectable is given by the following equation:

$$n_{ctr} = \frac{(n_{out})(w_{mux})}{n_{in}} \qquad (3)$$

Equation 3 clearly shows the relationship between connectivity and connectability. The product of the number of output conductors $n_{out}$ multiplied by the multiplexor width $w_{mux}$ is the total number of possible connections for the PIM and represents the connectivity of the PIM. Dividing the total number of possible connections by the number of input conductors $n_{in}$ yields the average number of connections, or chances to route, provided to each input conductor. This is the connectability of the PIM. When the multiplexor width $w_{mux}$ is equal to the number of input conductors $n_{in}$, each input signal is provided with a number of chances to route equal to the number of output conductors, $n_{out}$, and the PIM is fully connectable. As the multiplexor width $w_{mux}$ and the connectivity of the PIM decrease, the average number of chances to route $n_{ctr}$ provided to each input signal also decreases. Thus, connectability decreases as connectivity decreases.

Figure 4:
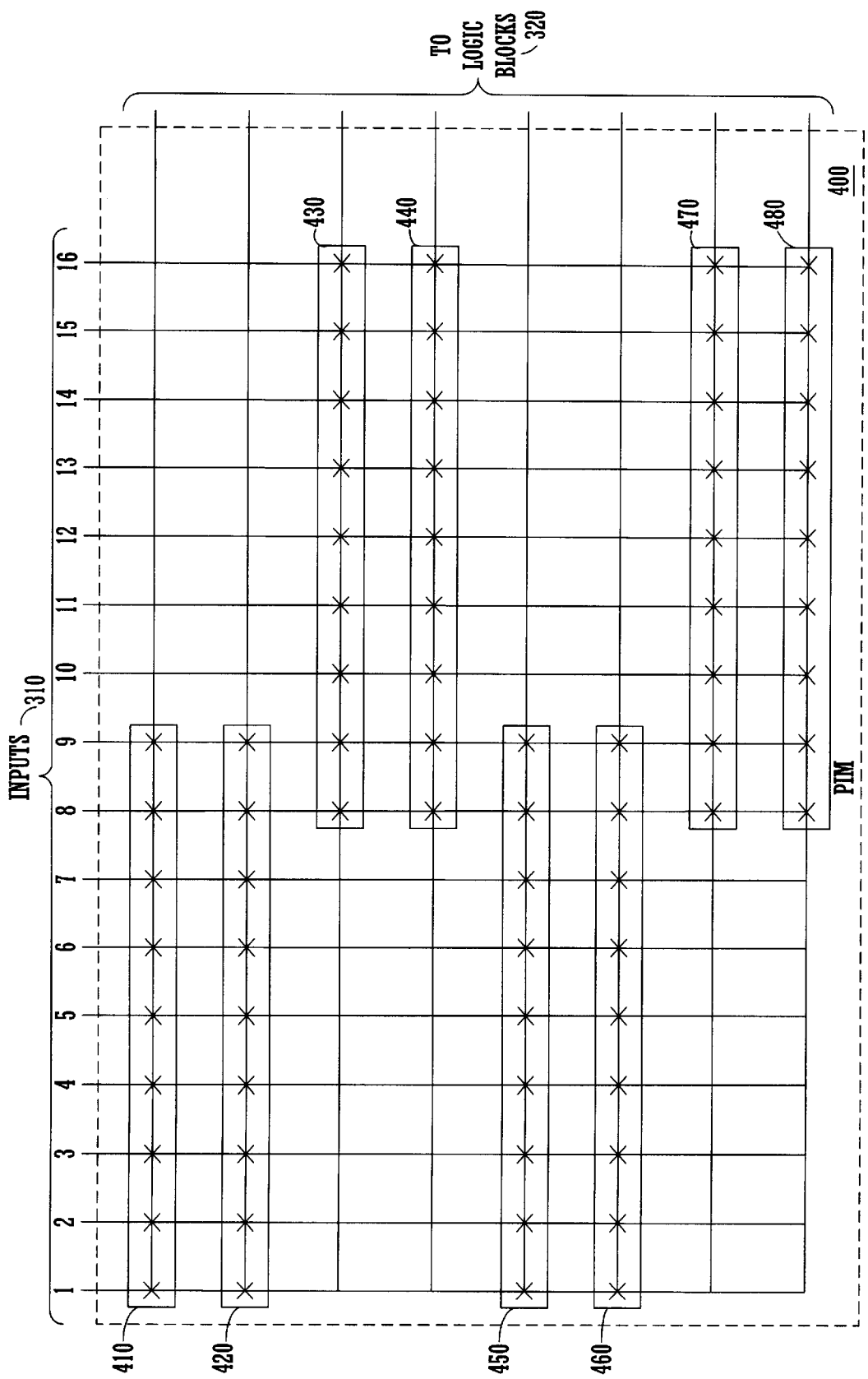
FIG. 4 shows a PIM having the minimum connectivity required for full routability.

FIG. 4 shows a PIM architecture having the minimum multiplexor width required to achieve full routability. According to equation 2, above, wherein $n_{in}$ is equal to sixteen and $n_{out}$ is equal to eight, $w_{mux}$ is equal to nine. Thus, each of the multiplexors 410–480 is a 9:1 multiplexor. Although the minimum connectivity to ensure full routability can be determined using equation 2, the arrangement of multiplexors to provide the optimum connectability and routability is not apparent. Thus, the precise arrangement of multiplexors in the PIM 400 has been selected using informed guesses dictated by the observation of the fully connectable PIM 300 of FIG. 3.

The PIM architecture of FIG. 4 is an example of a "maximum overlap" PIM architecture, wherein each multiplexor shares the same subset of inputs 310 with at least one other multiplexor. For example, the multiplexors 410 has the same input signals 1–9 as multiplexors 420, 450, and 460. Intuitively, the maximum overlap architecture of the PIM 400 provides a close approximation to the full overlap of the PIM 300 of FIG. 3. For those multiplexors having full overlap with one another, each input signal "competes" with the same set of input signals. The number of chances to route for each input signal, however, is not uniform, as some signals have four chances to route and other signals have eight chances to route. Thus, the connectability for each input conductor varies widely. It may be seen that, although the PIM 400 includes multiplexors having the minimum multiplexor width to achieve full routability, the PIM 400 is not fully routable. For example, the combination of input signals 1, 2, 3, 4, 5, 6, 7, and 8 cannot be routed by the PIM 400.

Figure 5:
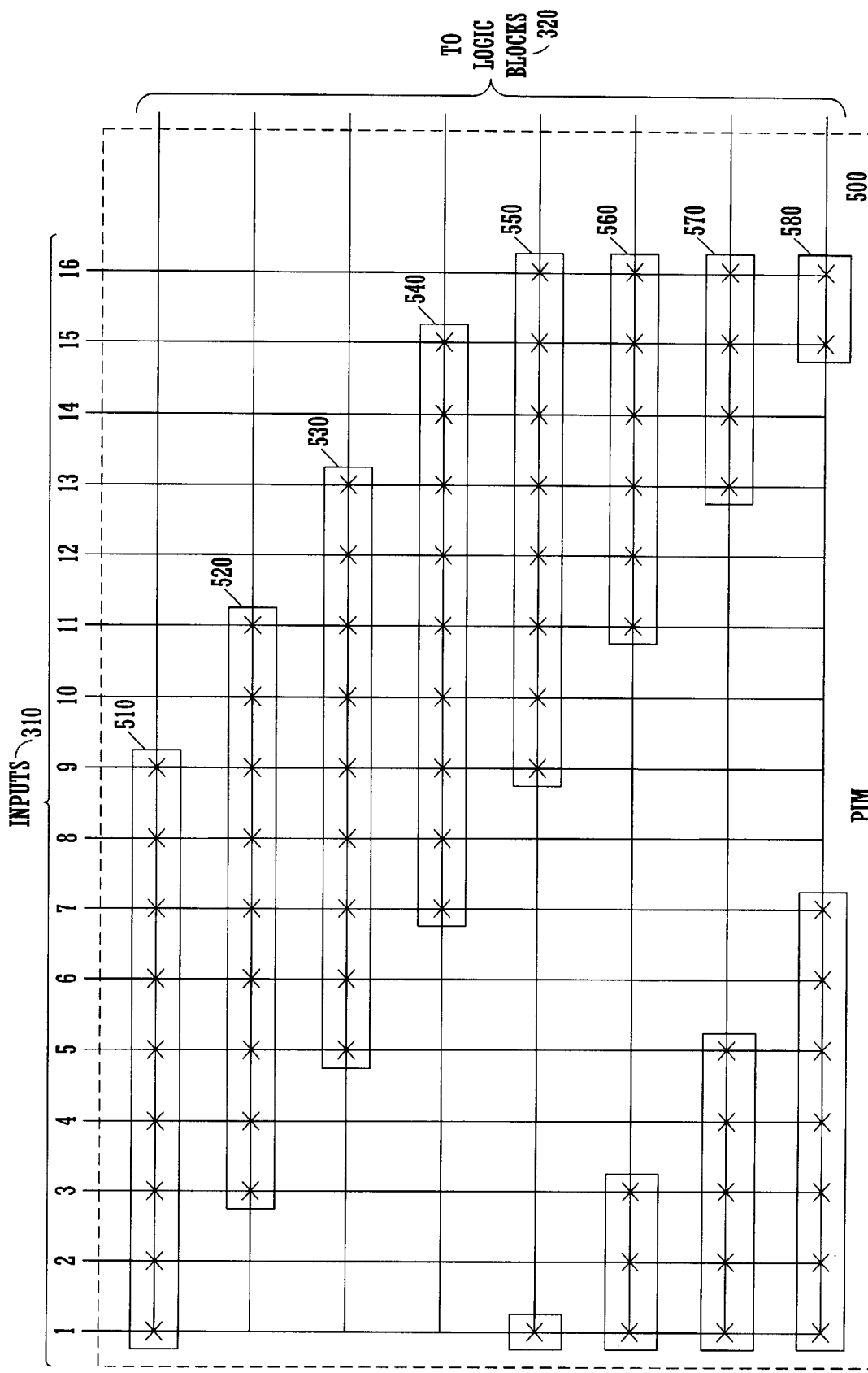
FIG. 5 shows a fully routable PIM.

FIG. 5 shows an alternative PIM architecture having a minimum multiplexor width for full routability. This architecture exhibits "uniform overlap" in which the amount of overlap between any two multiplexors is uniform throughout the PIM 500. For example, the maximum amount of overlap between any two multiplexors is equal to seven. For the PIM 500, half of the input signals have four chances to route, and the other half have five chances to route. The average number of chances to route for input signals of the PIM 500 is 4.5, the value given by equation 3. It may be seen that uniform overlap leads to a more even distribution of multiplexors for each input conductor. Thus, uniform chances to route is more closely approximated, and the connectability of each input signal is closer to the average number of chances to route dictated by equation 3. The input signals can be connected to the multiplexors in a number of different ways to achieve uniform overlap.

For PIM architectures having reduced connectivity, uniform overlap requires that the number of input conductors, and therefore input signals, shared between any two multiplexors is less than the multiplexor width. For example, multiplexor 510 shares seven input signals with each of the multiplexors 520 and 580. Each multiplexor that is connected to a given input conductor is said to "share" the input signal carried by that input conductor. As described below, the maximum amount of overlap between any two multiplexors to achieve uniform overlap can be expressed mathematically.

Figure 6:
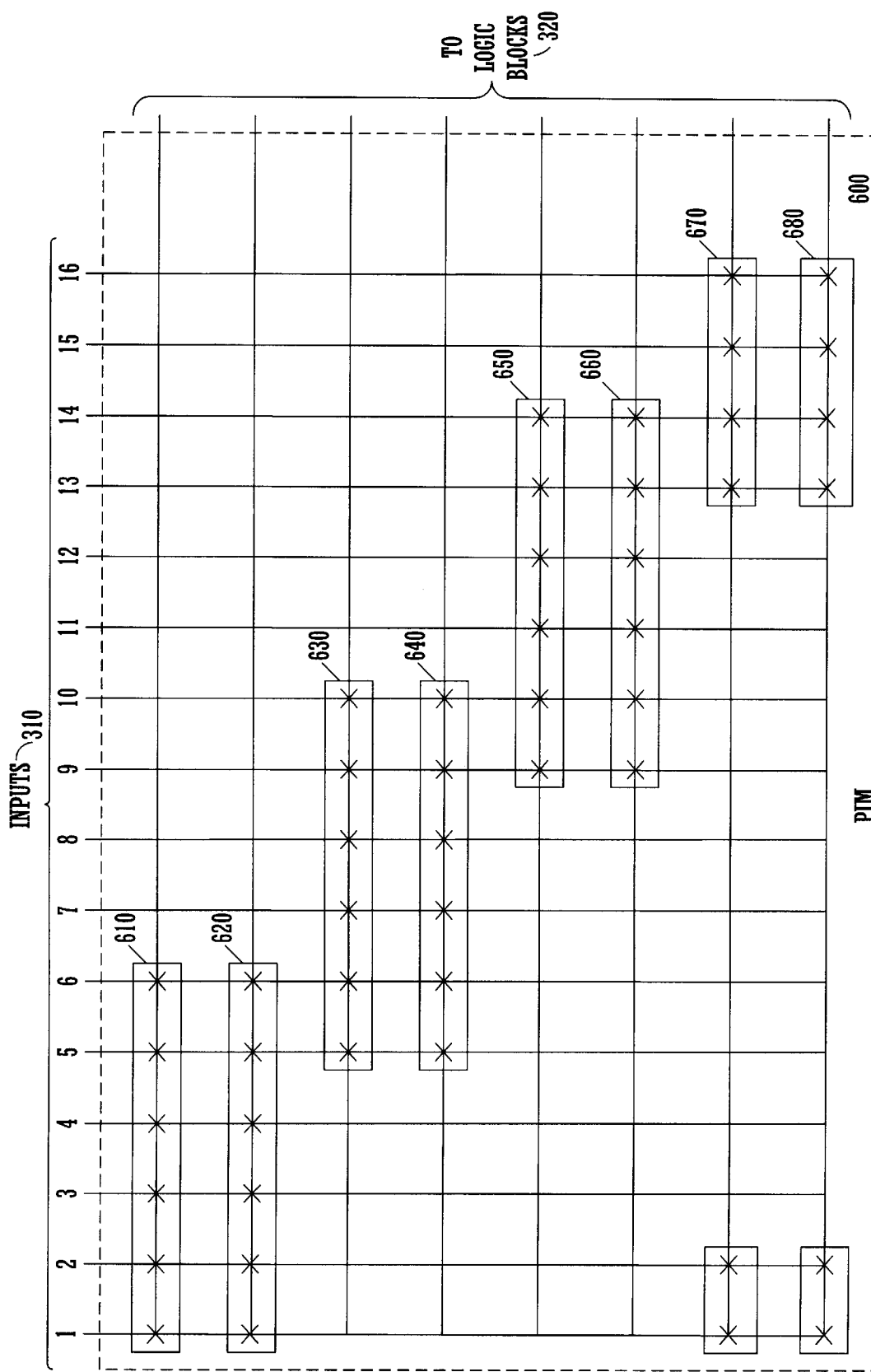
FIG. 6 shows a PIM having less than the minimum connectivity required for full routability.

FIG. 6 shows a PIM architecture having a multiplexor width resulting in less than full routability. Each of the multiplexors 610–680 is a 6:1 multiplexor. The PIM architecture of FIG. 6 also exhibits maximum overlap. For example, multiplexors 610 and 620 share all of the same input signals. Multiplexor pairs 630 and 640, 650 and 660, and 670 and 680 also share all of the same input signals. The number of chances to route, $n_{ctr}$ is equal to either two or four, depending on the particular input signal. Therefore the number of chances to route for each input signal is not uniform.

Analysis has shown that the PIM 600 provides only 8,910 routes for the possible 12,870 combinations of input signals. Thus, the PIM 600 is less than 70% routable, and the maximum overlap architecture of the PIM 600 falls drastically short of the maximum routability for a PIM having the given characteristics of $w_{mux}$, $n_{in}$, and $n_{out}$.

Figure 7:
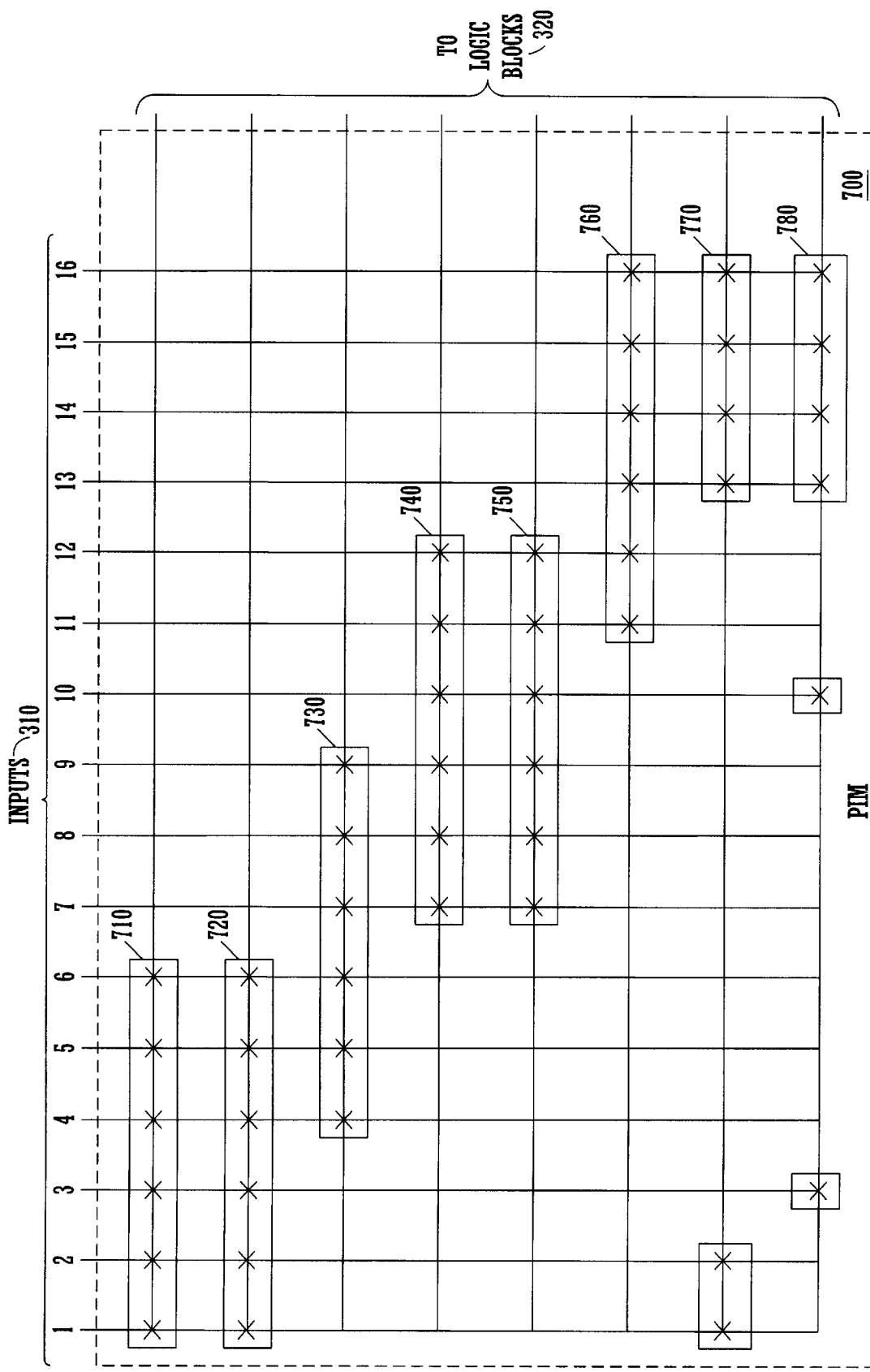
FIG. 7 shows another PIM having less than the minimum connectivity required for full routability.

FIG. 7 shows a PIM architecture having maximum overlap and uniform number of chances to route. As shown, each input signal has a number of chances to route, $n_{ctr}$, equal to 3. Analysis has shown that the number of routes provided by the PIM 700 is equal to 9,934, and the routability for this PIM approximately architecture is equal to 77%. Compared to the results for the PIM architecture of FIG. 6, the present PIM architecture provides an increased routability. Thus, uniform number of chances to route seems desirable.

Figure 8:
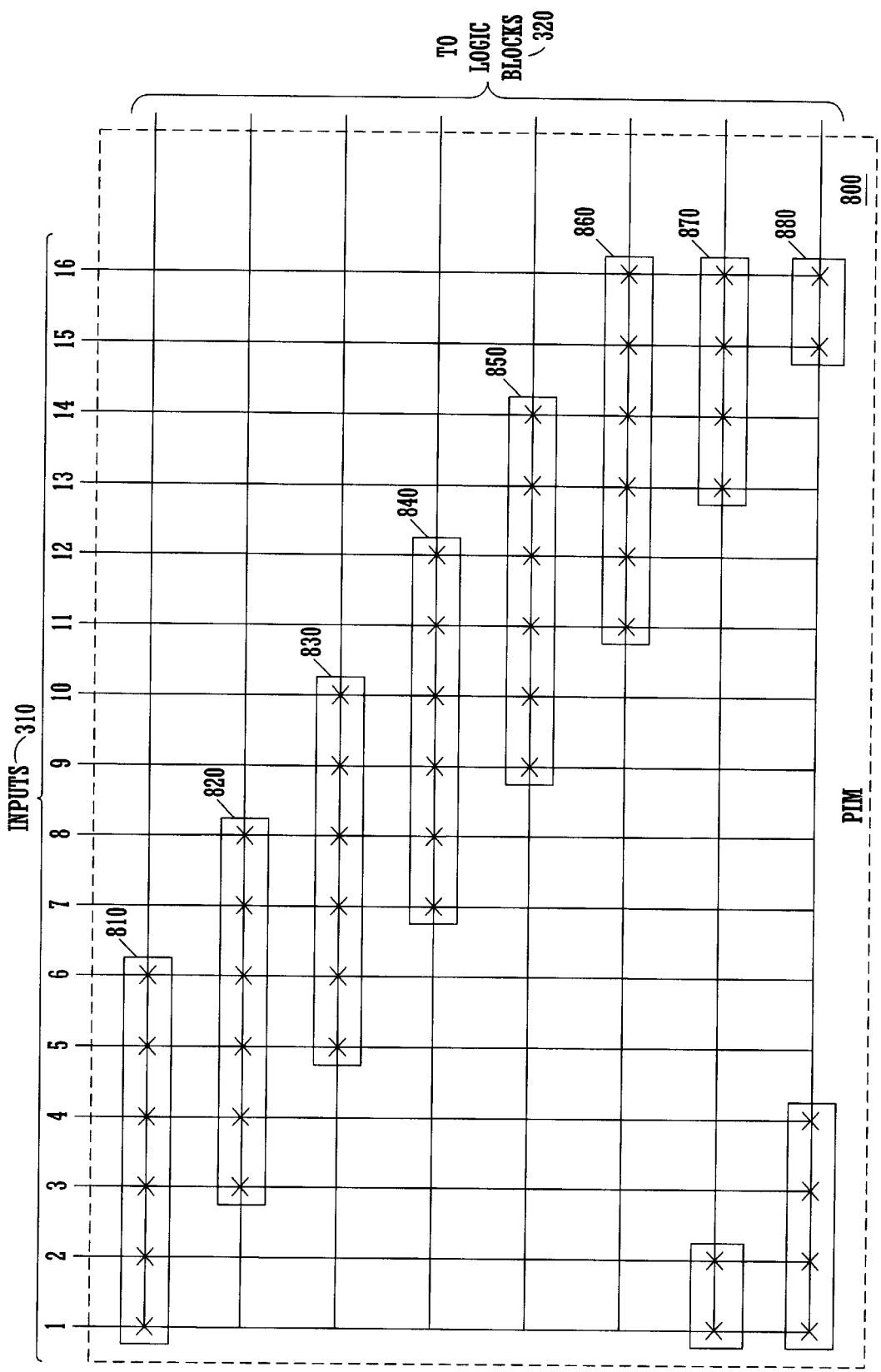
FIG. 8 shows a PIM having the maximum routability for the given connectivity.

FIG. 8 shows a PIM architecture having both uniform overlap and uniform number of chances to route. The number of routes for the PIM architecture of FIG. 8 is equal to 12,158, or 94% routability. Thus, uniform overlap and uniform number of chances to route yields a markedly increased routability compared to the PIM architectures of FIGS. 6 and 7.

Figure 9:
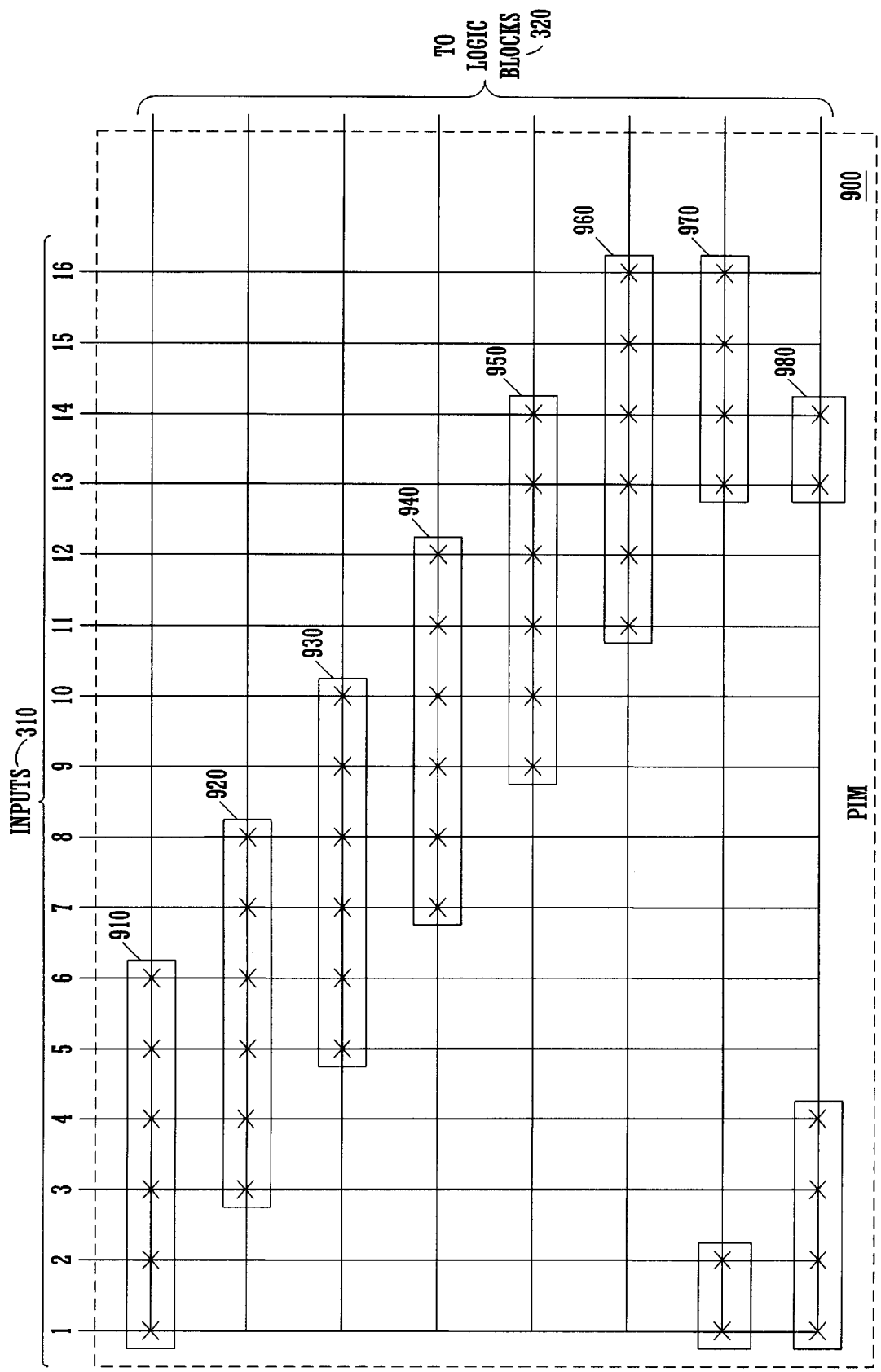
FIG. 9 shows another PIM having less than the minimum connectivity required for full routability.

To show that the PIM architecture of FIG. 8 is the optimized architecture, the PIM architecture of FIG. 9 is shown. The architecture of PIM 900 is simply that of FIG. 8 wherein two of the input signals of multiplexor 980 have been switched with different input signals such that the number of chances to route is not uniform for each input signal. Specifically, input signals 15 and 16 have an $n_{ctr}$ equal to two, input signals 13 and 14 have an $n_{ctr}$ equal to four and the remaining input signals have an $n_{ctr}$ equal to three. The routability of this PIM architecture is equal to 83%.

The PIM architectures of FIGS. 6–9 demonstrate that the arrangement of the multiplexors with respect to one another within the PIM has a significant effect on the routability of the PIM. One explanation for this effect is that the number of input signals that are shared between any two multiplexors is assured to be less than the multiplexor width, $w_{mux}$. Further, each multiplexor shares the maximum number of shared input signals with at least two other multiplexors, but the two sets of shared input signals do not include identical input signals. For example, returning to FIG. 8, multiplexor 820 shares input signals 3, 4, 5, and 6 with multiplexor 810 and shares input signals 5, 6, 7, and 8 with multiplexor 830. Additionally, both the number of multiplexors that each multiplexor shares input signals with and the number of input signals shared with each multiplexor are identical for each multiplexor. For the PIM 800, each multiplexor shares four input signals with two multiplexors, two input signals with two multiplexors, and no input signals with the remaining multiplexors. These numbers differ for different multiplexor widths, numbers of input conductors, and numbers of output conductors.

Therefore, it is the combination of uniform overlap and uniform number of chances to route that results in a PIM design having maximum routability for a given level of connectivity. Wherein uniform overlap suggests that the amount of competition for each multiplexor is important, uniform chances to route suggests that the nature of the competition is just as important. Combined, the two characteristics yield a form of distributed competition. A direct result of this distributed competition is a PIM having maximum routability for a given level of connectivity.

To achieve uniform overlap, the maximum amount of overlap between any two multiplexors is given by the following equation:

$$n_{ovr} = \frac{(n_{out})(w_{mux}) - (n_{in})}{n_{out}} \tag{4}$$

Wherein $n_{ovr}$ is an integer, each multiplexor shares $n_{ovr}$ input signals with at least two other multiplexors. Wherein $n_{ovr}$ is not an integer, uniform overlap cannot be achieved for the entire PIM. For such a case, the quantity $n_{ovr}$ should be viewed as an average overlap for the PIM To achieve the average overlap given by a non-integer value of $n_{ovr}$, the values of $n_{ovrmin}$ and $n_{ovrmax}$ are first determined. The quantity $n_{ovrmin}$ is simply the non-integer value of $n_{ovr}$ rounded down to the nearest integer. Similarly, the quantity $n_{ovrmax}$ is the non-integer value of $n_{ovr}$ rounded up to the nearest integer. The number of multiplexors $N_{ovrmin}$ of the PIM having overlap defined by the quantity $n_{ovrmin}$ are given by the following equation:

$$N_{ovr\ min} = n_{out}(n_{ovr\ max} - n_{ovr}) \tag{5}$$

The number of multiplexors $N_{ovrmax}$ having overlap defined by the quantity $n_{ovrmax}$ is given by the following equation:

$$N_{ovr\ max} = n_{out}(n_{ovr} - n_{ovr\ max}) \tag{6}$$

It is also possible that the quantity $n_{ctr}$ may not be an integer. To best approximate a uniform number of chances to route, the number of chances to route provided for each input signal should be one of two possible values $n_{ctrmin}$ and $n_{ctrmax}$ wherein $n_{ctrmin}$ is the non-integer value $n_{ctr}$ rounded down to the nearest integer and $n_{ctrmax}$ is the non-integer value $n_{ctr}$ rounded up to the nearest integer. The number of input signals $N_{ctrmin}$ of the PIM having the minimum number of chances to route $n_{ctrmin}$ is given by the following equation:

$$N_{ctr\ min} = n_{in}(n_{ctr\ max} - n_{ctr}). \tag{7}$$

The number of input signals $N_{ctrmax}$ having the maximum number of chances to route is given by the following equation:

$$N_{ctr\ max} = n_{in}(n_{ctr} - n_{ctr\ min}). \tag{8}$$

The multiplexor width $w_{mux}$ affects the ability to achieve both uniform overlap and uniform chances to route. If $w_{mux}$ is too small, some input signals will have no chances to route. If $w_{mux}$ is too large, the maximum overlap between any two multiplexors will exceed the maximum overlap given by $n_{ovr}$. Therefore, to better ensure both uniform overlap and uniform chances to route, a range of multiplexor widths for any given number of input and output conductors is given by the following equation.

$$n_{in} - n_{in}/n_{out} \geq w_{mux} \geq n_{in}/n_{out}. \tag{9}$$

As $w_{mux}$ decreases below the the optimal $w_{mux}$ given by equation 2, the number of multiplexors that each multiplexor shares input signals with decreases. As $w_{mux}$ increases above the the optimal $w_{mux}$ given by equation 2, the number of multiplexors that each multiplexor shares $n_{ovr}$ input signals with increases.

To this point, it has been assumed that the number of multiplexors $n_{mux}$ and the number of output conductors $n_{out}$ of the PIM are equal to the maximum number of input signals that a device coupled to the output conductors of the PIM can accept. For example, FIG. 1 shows a product term array that can accept thirty-six input terms and their complements. Therefore, the PIM 110 provides thirty six-output conductors.

To increase the routability, the number of multiplexors $n_{mux}$ can be increased to exceed the number of input terms requested by the product term array; however, the maximum number of input signals that can be routed by the PIM remains fixed. This means 1) that the maximum number of input signal combinations requiring routes through the PIM remain fixed and 2) that the connectivity is increased. These two effects result in increased routability, and the increase in connectivity is rather small when compared to the benefits from adding additional multiplexors.

Although increasing the number of multiplexors increases the number of output conductors from $n_{out}$ to $n_{out}'$, the maximum number of output conductors that the product term array uses remains fixed at $n_{out}$. Conceptually, this may be thought of as adding extra multiplexors to the PIM without adding additional output conductors. Therefore, the equations 2, 3, 4, 5, 6, and 9 become, respectively:

$$w_{mux} = n_{in} - n_{mux} + 1, \quad (2a)$$

$$n_{ctr} = \frac{(n_{mux})(w_{mux})}{(n_{in})}, \quad (3a)$$

$$n_{ovr} = \frac{(n_{mux})(w_{mux}) - (n_{in})}{n_{mux}}, \quad (4a)$$

$$N_{ovrmin} = n_{mux}(n_{ovrmax} - n_{ovr}), \quad (5a)$$

$$N_{ovrmax} = n_{mux}(n_{ovr} - n_{ovrmin}), \quad (6a)$$

$$n_{in} - \frac{n_{in}}{n_{mux}} \geq w_{mux} \geq \frac{n_{in}}{n_{mux}}, \quad (9a)$$

wherein $n_{mux} = n_{out}' > n_{out}$. To determine the number of possible combinations of input signals, equation 1 is still applied, wherein $n_{out}$ is equal to the maximum number of input signals requested by the device coupled to the output of the PIM.

Additional multiplexors may be used to decrease multiplexor width, to adjust the quantity $n_{ovr}$ such that it is an integer, and to adjust the quantity $n_{ctr}$ such that it is an integer. Typically, only one of the variables $n_{ovr}$ and $n_{ctr}$ may be adjusted to an integer quantity. For most cases, adjusting $n_{ctr}$ requires a smaller increase in the number of multiplexors, $n_{mux}$. Regardless of the number of multiplexors that exceeds the number of outputs, the additional multiplexors increases the maximum possible number of routes through the PIM.

Figure 10:
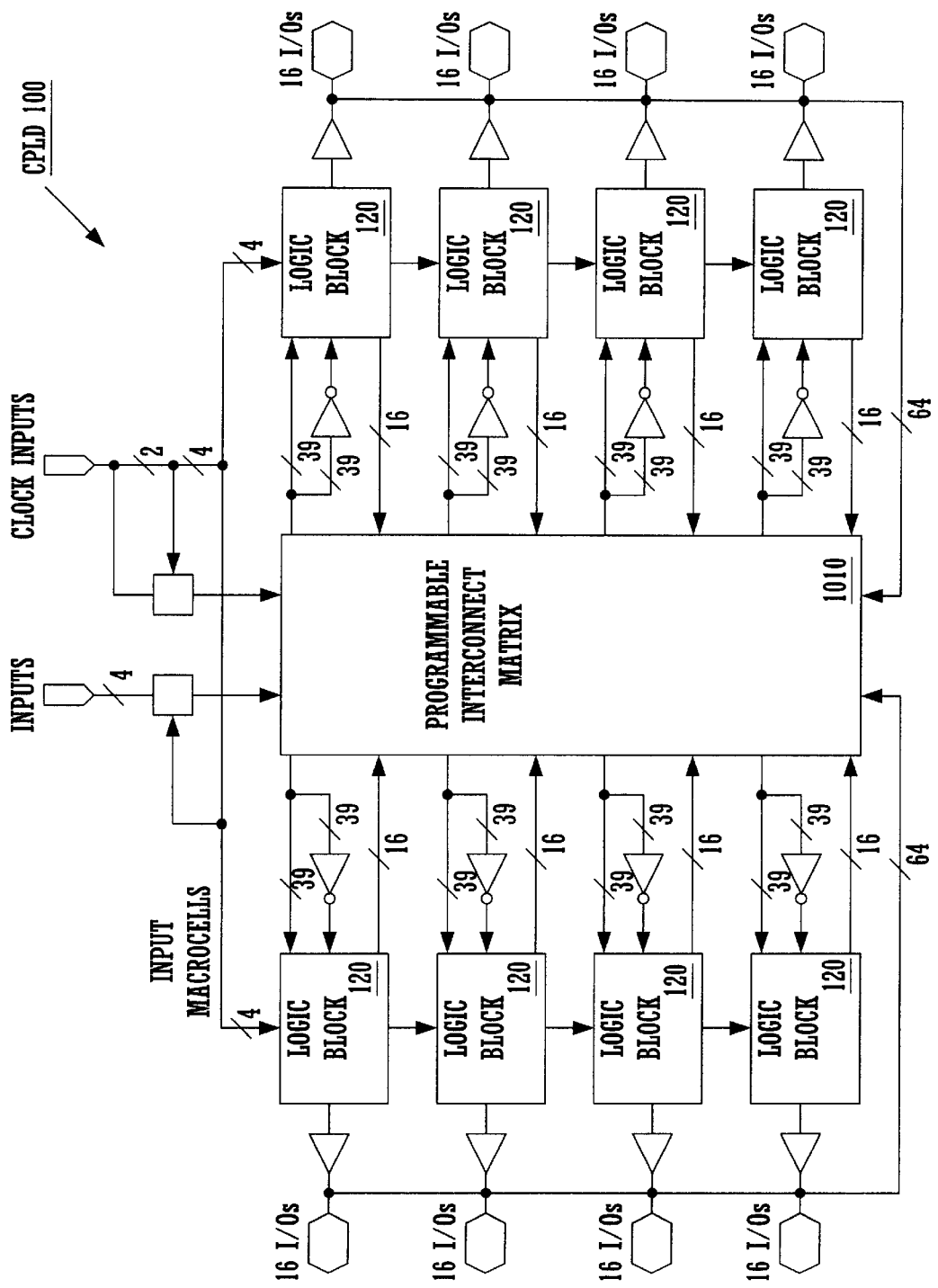
FIG. 10 shows a CPLD having a PIM that includes more multiplexors than PIM output conductors.

FIG. 10 shows a CPLD including a PIM having additional multiplexors. The CPLD 1000 has essentially the same architecture as CPLD 100 of FIG. 1 with the exception that seventy-eight output lines are provided to each logic block. Only seventy-two of these seventy-eight PIM outputs are selected at any given time. If the multiplexor $w_{mux}$ for the PIM 1010 is equal to twenty, the number of chances to route $n_{ctr}$ is equal to 2.97 instead of 2.75, which is the $n_{ctr}$ for the PIM 110. The PIM architecture for the PIM 1010 can therefore more nearly approximate a uniform chances to route PIM architecture.

Figure 11:
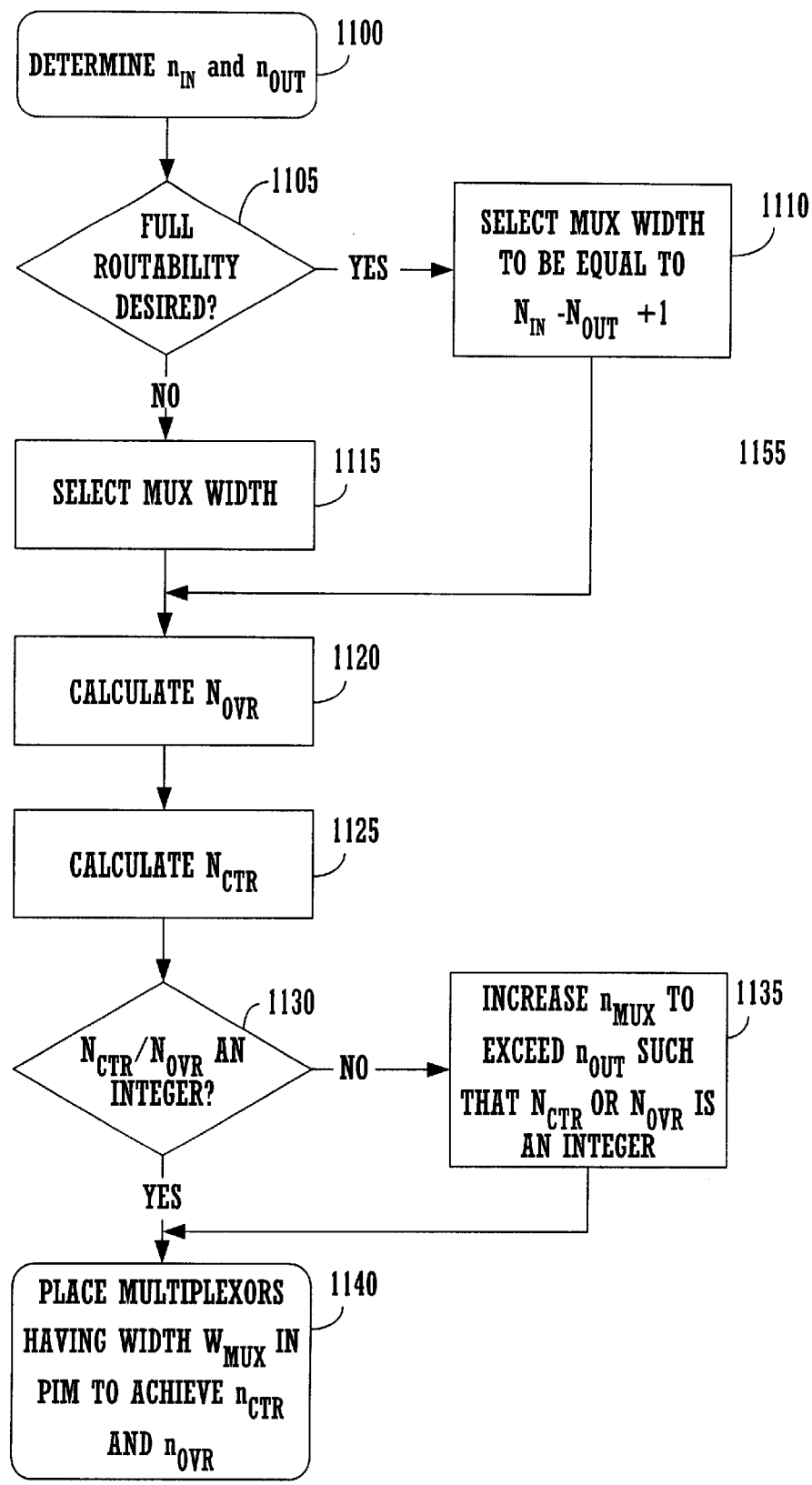
FIG. 11 is a flow chart showing a method for designing a PIM according to one embodiment.

FIG. 11 is a flow diagram summarizing the architectural design approaches described above. At step 1100, the PIM designer determines the number of inputs, $n_{in}$, and the number of outputs, $n_{out}$, for the PIM. The number of PIM inputs and outputs are typically determined by the characteristics of the CPLD. At step 1105, the designer determines if full routability is desired. If full routability is desired, the multiplexor width, $w_{mux}$, is determined using equation 2 at step 1110. Alternatively, if the designer intends to use more multiplexors than there are PIM outputs, the designer uses equation 2a at step 1110 to determine $w_{mux}$.

If full routability is not desired, the designer selects the multiplexor width $w_{mux}$ at step 1115. The selection of $w_{mux}$ should be made with the understanding that the number of possible routes decreases as the multiplexor width drops below the minimum multiplexor width given by equation 2.

At step 1120, the amount of overlap $n_{ovr}$ for the PIM is determined using equation 3. At step 1125, the number of chances to route $n_{ctr}$ is determined using equation 4.

At step 1130, it is determined whether $n_{ctr}$ and/or $n_{ovr}$ are integer quantities. If the quantity $n_{ovr}$ is an integer, uniform overlap can be achieved. If the quantity $n_{ctr}$ is an integer, a uniform number of chances to route can be achieved.

If either of the quantities $n_{ctr}$ or $n_{ovr}$ are not integers, the number of multiplexors $n_{mux}$ can be increased such that $n_{mux}$ exceeds the number of PIM outputs $n_{out}$. The number of chances to route $n_{ctr}$ and the amount of overlap $n_{ovr}$ can be recalculated using equations 4a and 3a, respectively. Typically, adjusting the number of chances to route $n_{ctr}$ towards an integer value results in a smaller net increase in the number of multiplexors $n_{mux}$.

At step 1140, multiplexors having the multiplexor width of $w_{mux}$ are arranged in the PIM such that the PIM has the qualities defined by the quantities of $n_{ctr}$ and $n_{ovr}$. IIF the quantity $nctn_{ctr}$ r is not an integer, some portion of the input signals are assigned a number of chances to route $n_{nctrmin}$, and the remaining input signals are assigned a number of chances to route $n_{ctrmax}$ such that the average number of chances to route for input signals of the PIM is equal to $n_{ctr}$. Similarly, if the quantity $n_{ovr}$ is not an integer, some multiplexors have an overlap of $n_{ovrmin}$, and the remaining multiplexors have an overlap $n_{ovrmax}$ such that the average overlap of multiplexors in the PIM is equal to $n_{ovr}$.

The flow chart of FIG. 11 is only one to apply the observations and methodology described above. For example, the PIM designer may initially define a desired value of $n_{ctr}$ and calculate wmux and $n_{ovr}$ using the above equations.

Thus far, the discussion has focused on the PIM architecture. As mentioned previously, however, even if the PIM architecture is physically capable of routing a particular combination of input signals to the PIM outputs, a poorly conceived routing method may result in the under utilization of the PIM. Routers, or routing programs, for fully connectable product term arrays are fairly straightforward because fully connectable architectures allow any permutation of a particular combination of input signals to be routed. As connectability decreases, the probability that one or more permutations of a particular combination cannot be routed increases. If the routing method implemented by the router does not account for this phenomenon, the routability of the PIM is underutilized. This may destroy pin-for-pin compatibility for the CPLD from one revision of the CPLD program to the next.

Figure 12:
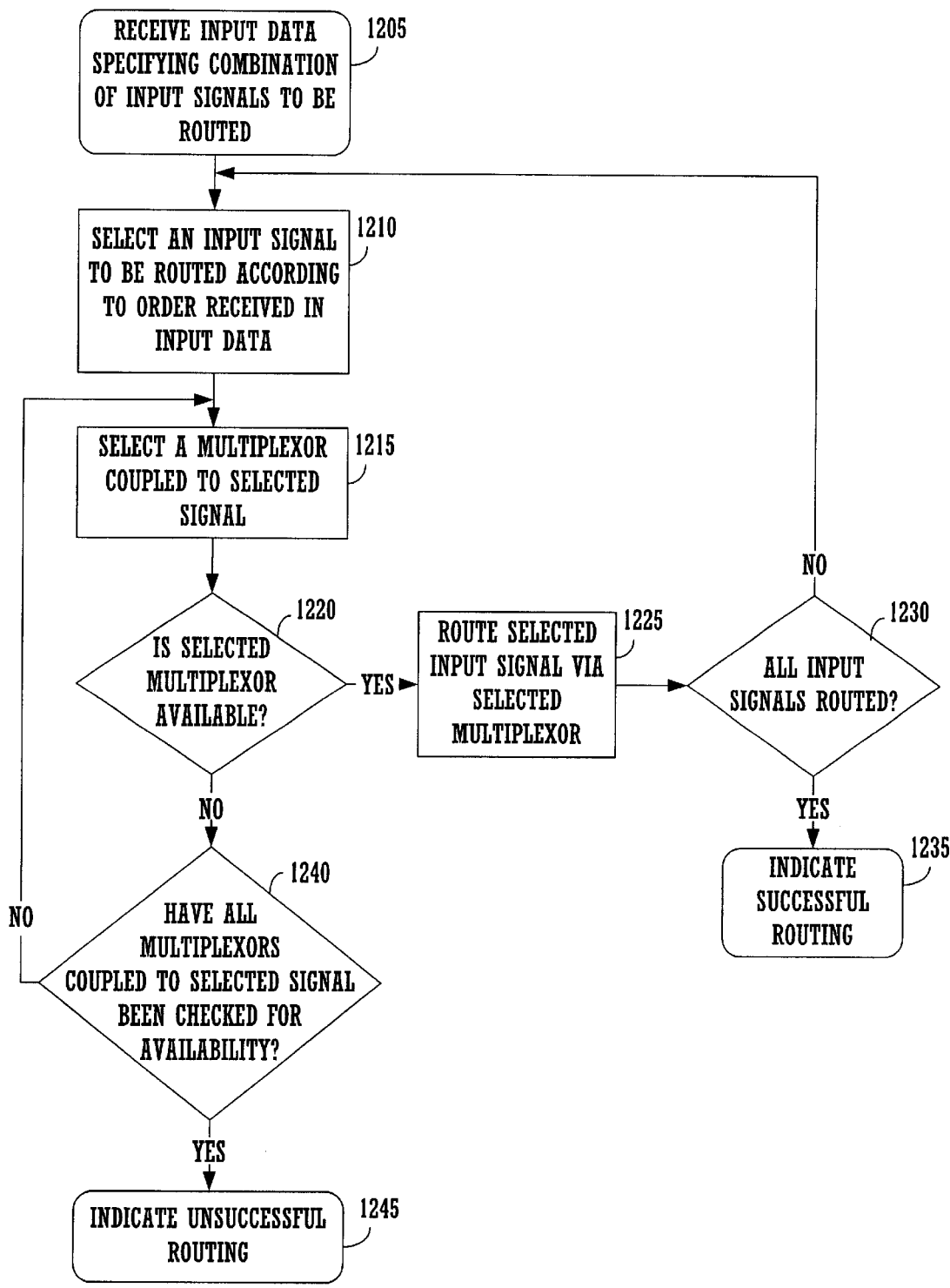
FIG. 12 is a flow chart showing a routing method for a fully connectable PIM.

FIG. 12 shows a routing method that may be used to route combinations of input signals via a fully connectable PIM. When programming the PIM, a user selects a subset of the available input conductors to connect to the outputs of the PIM. The maximum number of input signals that may be routed to the outputs of the PIM is equal to the number of output conductors $n_{out}$. Of course, the user may choose a combinations of input signals that includes less than $n_{out}$ input signals.

When an input signal is successfully routed via an available multiplexor, that input signal is said to have "captured" the multiplexor. To route the combination of input signals, the router maintains information about each input signal including information regarding which multiplexors are capable of routing the input signal and which multiplexor, if any, has been captured by the input signal. The router also maintains information regarding each multiplexor including information regarding whether a multiplexor is captured and which input signal has captured the multiplexor.

At step 1205, the router receives input data indicating to which input signals are to be routed. A user determines the particular combination of input signals and delivers the combination as input data to the router. The input signals are sequentially routed in the order corresponding to their order in the input data. At step 1210, the next input signal contained in the sequence of the input data is selected for routing through the PIM. At step 1215, the router selects a multiplexor that is coupled to the selected input signal. For the sake of simplicity, it is assumed that the multiplexors are selected in ascending order based on the output conductor to which each multiplexor is connected.

At step 1220, the router determines whether the selected multiplexor is available for routing the selected input signal or if the selected multiplexor has been otherwise captured for routing another input signal of the combination. If the selected multiplexor is available, the selected input signal is routed through the selected multiplexor at step 1225. An input signal that captures a multiplexor is a "capturing" input signal. The selected multiplexor thus becomes unavailable for routing subsequent input signals.

At step 1230, it is determined whether all of the input signals of the combination are routed. If all the input signals of the combination are routed, the router returns a value indicating successful routing at step 1235. If one or more input signals remains to be routed, the next input signal in the sequence is chosen at step 1210, and steps 1215 and 1220 are repeated. An input signal that cannot be routed because all multiplexors capable of routing the input signal have been captured is said to be a "blocked" input signal.

If the selected multiplexor is not available at step 1220, it is determined whether all multiplexors to which the selected signal is coupled have been checked for availability at step 1240. Steps 1215, 1220, and 1240 are repeated until an available multiplexor is found or until all multiplexors have been determined to be unavailable at step 1240. If all multiplexors have been checked and are not available for routing the selected input signal, the router returns a value indicating unsuccessful routing of the combination of input signals at step 1245. The selected input signal is blocked.

The routing method of FIG. 12 is sufficient to successfully route combinations of input signals through a fully connectable PIM. However, for PIMs that are less than fully connectable, the programming method may result in under utilization of the routability of the PIM. Under utilization may even occur when the PIM is fully routable.

Figure 13:
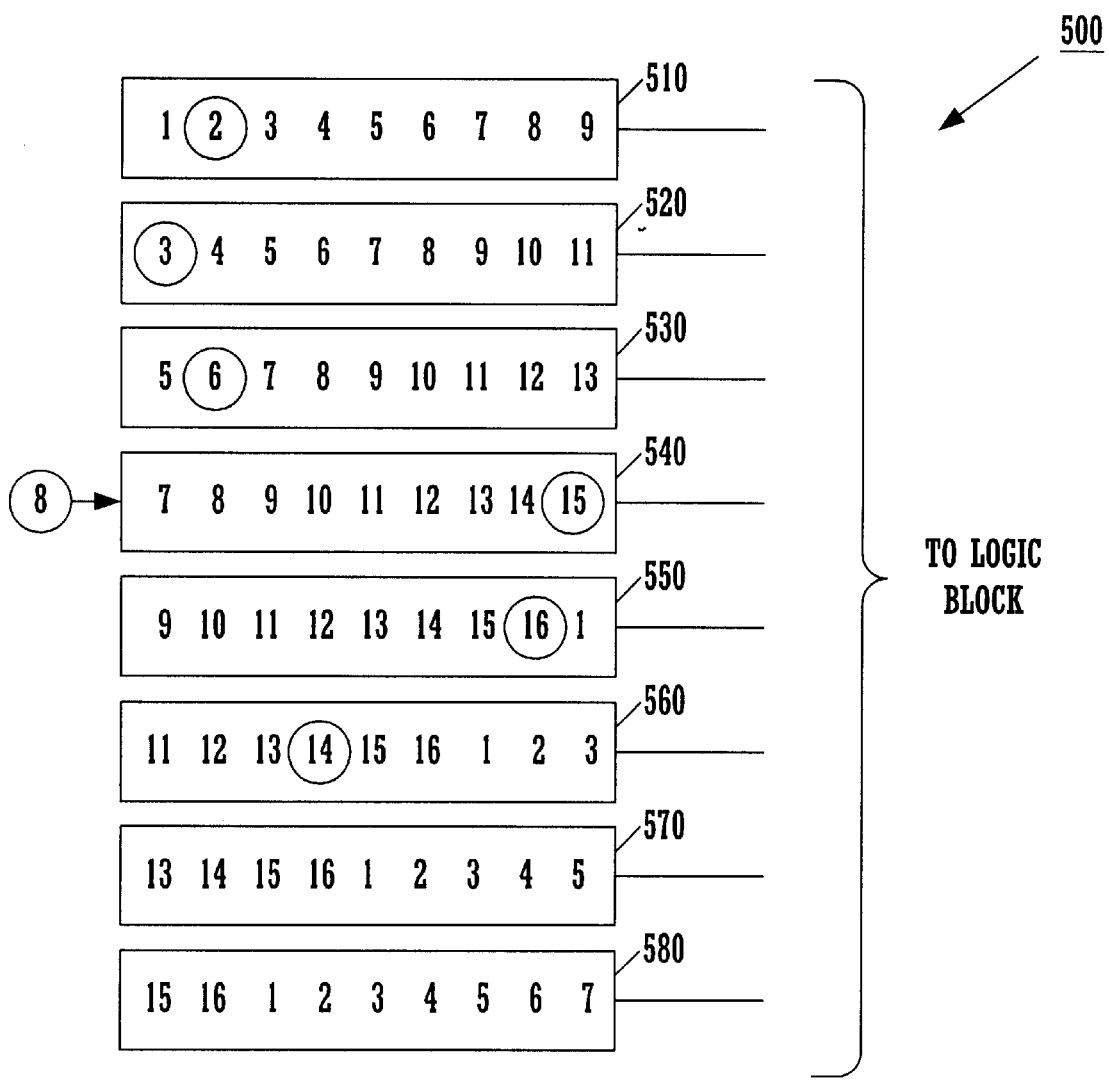
FIG. 13 shows an attempted routing through a PIM using the method shown in FIG. 12.

To better illustrate the operation of the router in routing input signals to the output conductors of the PIM, FIG. 13 shows the multiplexors 510–580 in a different form than shown in FIG. 5. Each multiplexor is shown as a box containing nine numbers. Each number corresponds to one of the sixteen input signals provided by the sixteen input conductors of the PIM 500. A number that is circled indicates the number of the input signal that has captured the multiplexor. A blocked input signal is indicated by a circle containing the number of the blocked input signal. An arrow that extends from the circle indicates the multiplexor currently selected for determining availability.

FIGS. 12 and 13 are now discussed in combination to demonstrate the shortcomings of the routing method of FIG. 12. As shown, the PIM of FIG. 13 is a fully routable PIM architecture. At step 1205, the router receives input data indicating that a combination of the input signals 16, 15, 14, 2, 3, 6, 8, and 9 are to be routed through the PIM 500. The first input signal in the sequence of the input data is the input signal 16, which is selected by the router at step 1210. At step 1215, the router selects multiplexor 550, which is the first multiplexor in the sequence of multiplexors 510–580 to which the input signal 16 is coupled. Multiplexor 550 is captured by input signal 16.

Figure 14:
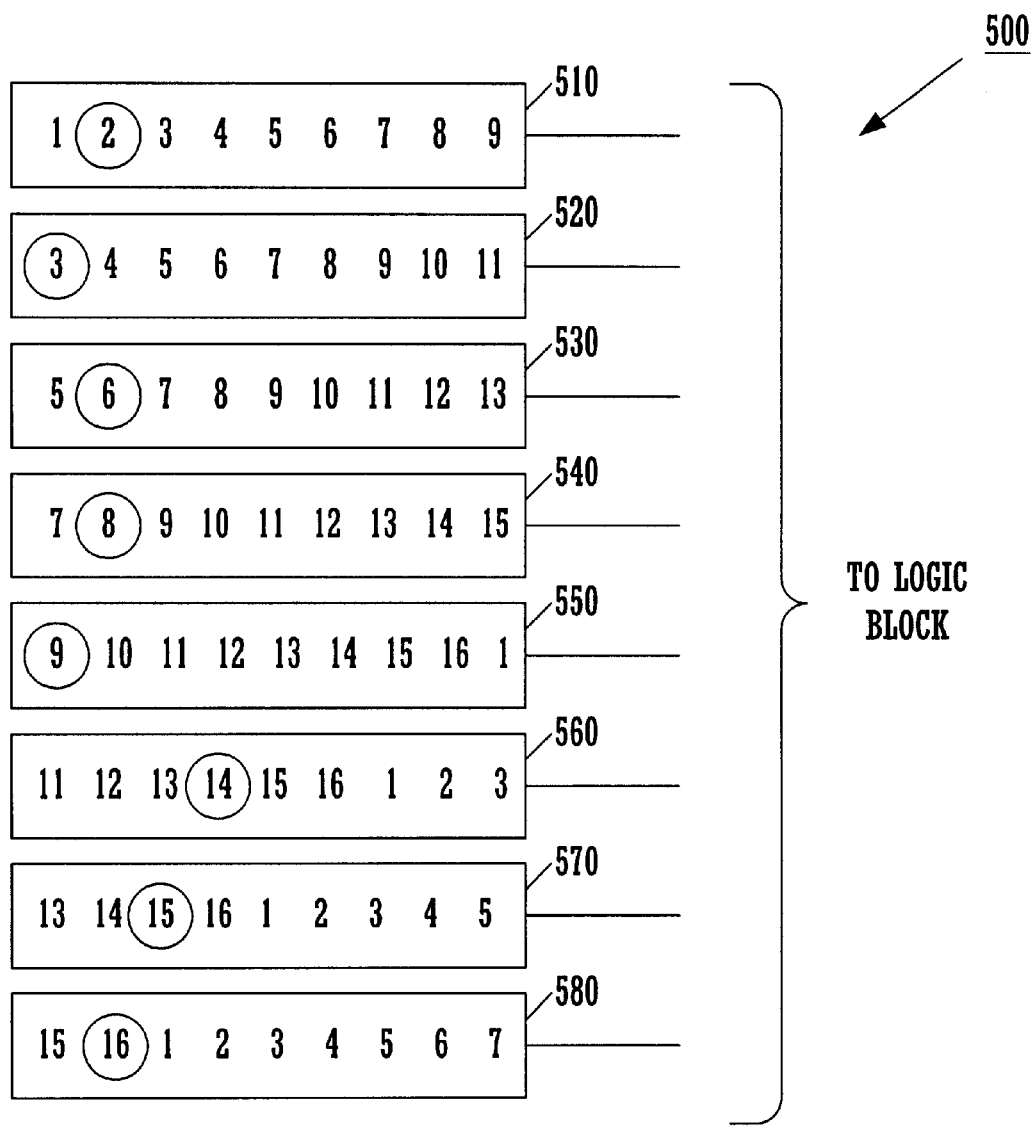
FIG. 14 shows a possible routing of an input signal through the PIM.

The process continues such that input signals 15, 14, 2, 3, and 6 capture multiplexors 540, 560, 510, 520, and 530, respectively. The routing of input signal 8, however, is blocked because there are no multiplexors available to route input signal 8. According to the routing method shown in FIG. 12, the router must return a value indicating that the desired combination of input signals cannot be routed. FIG. 14 clearly shows, however, that the combination of the input signals 16, 15, 14, 2, 3, 6, 8, and 9 can be routed through the PIM 500. Thus, the routing method of FIG. 12 under utilizes the routability of the PIM.

Figure 15A:
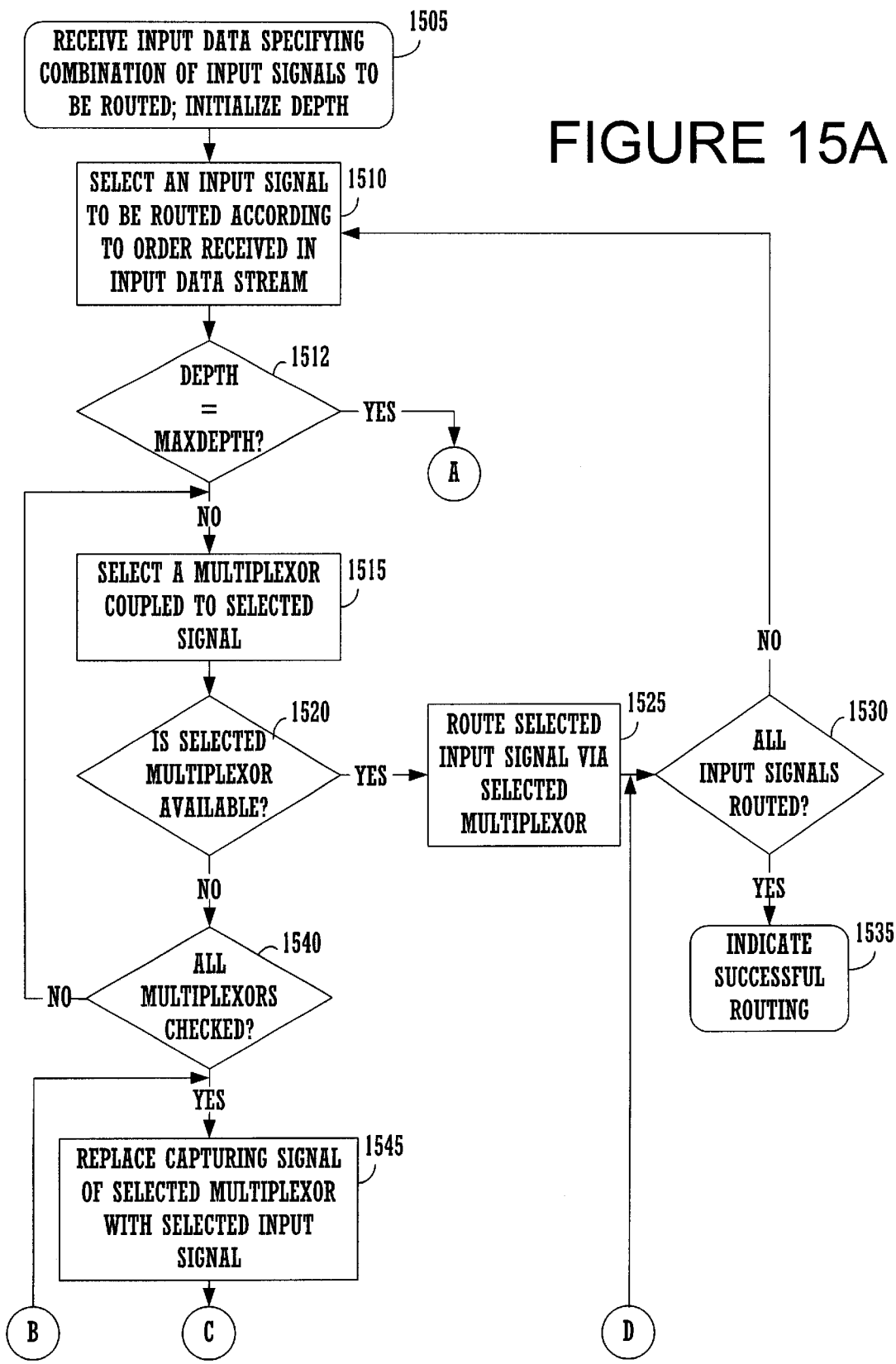
FIG. 15A is a flow chart showing a routing method according to one embodiment.
Figure 15B:
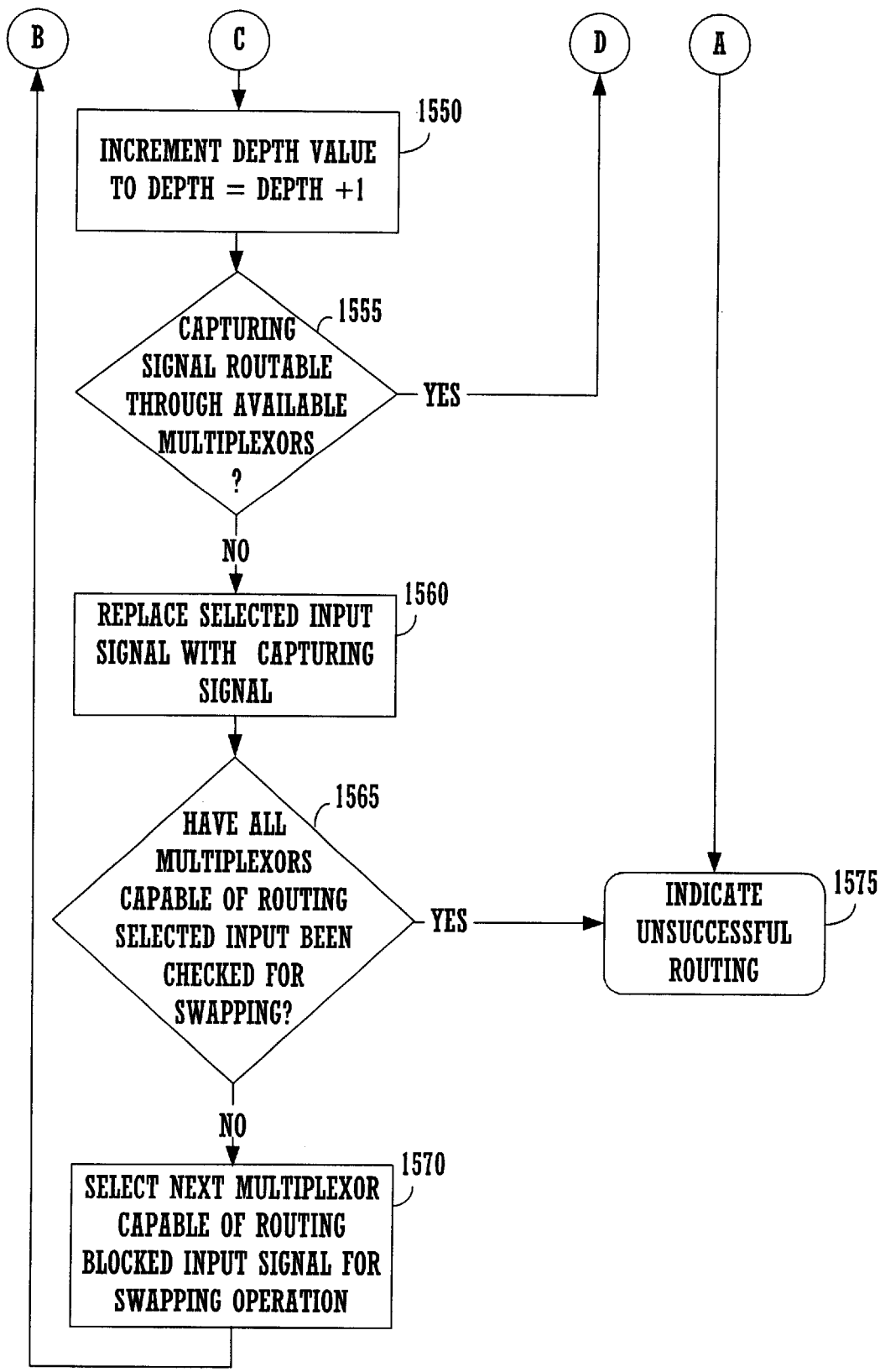
FIG. 15B continues the flow chart of FIG. 15A.

FIGS. 15A and 15B show an improved routing method. Unlike the routing method shown in FIG. 12, the present routing method does not end when the routing of an input signal is blocked. Instead, the routing method of FIGS. 15A and 15B frees a previously unavailable multiplexor that is capable of routing the blocked input signal by removing the route for the capturing signal. The blocked input signal is then routed through the now available multiplexor, and the router attempts to reroute the capturing signal, which no longer has a route through the PIM. This process of replacing the capturing signal of a multiplexor with a blocked input signal is known as "swapping."

At step 1505, the router receives input data that indicates which input signals are to be routed. A user determines the particular combination of input signals and delivers the combination as input data to the router. The input signals are sequentially routed in the order corresponding to their order in the input data. Further, a depth value, DEPTH, for the input signal is initialized to an initial value. The depth value indicates the number of swaps that have occurred. The depth value is incremented as swaps occur. The router monitors the depth value to determine if the depth value is equal to a maximum depth value, MAXDEPTH.

At step 1510, the next input signal contained in the sequence of the input data is selected for routing through the PIM. At step 1512, it is determined whether depth value is equal to the maximum depth value. If not, the flow continues at step 1515, where the router selects a multiplexor that coupled to the selected input signal. At step 1520, the router determines whether the selected multiplexor is available for routing the selected input signal or if the selected multiplexor has been otherwise captured for routing another input signal of the combination. If the selected multiplexor is available, the selected input signal is routed through the selected multiplexor at step 1525. The selected multiplexor thus becomes unavailable for routing subsequent input signals. At step 1530, it is determined whether all of the input signals of the combination are routed. If all the input signals of the combination are routed, the router returns a value indicating successful routing at step 1535. If one or more input signals remains to be routed, the next input signal in the sequence is chosen at step 1510, and steps 1512, 1515 and 1520 are repeated.

If the selected multiplexor is not available at step 1520, it is determined whether all of the multiplexors to which the selected input signal is coupled have been checked for availability at step 1540. Steps 1515, 1520, and 1540 are repeated until an available multiplexor is found or until all multiplexors are determined to be unavailable at step 1540. If no multiplexor is available for routing, the selected input signal is a blocked input signal.

The router begins processing of blocked input signals at step 1545, when the router replaces the capturing signal of the selected multiplexor with the blocked input signal. The flow chart continues at FIG. 15B, where the depth value is incremented at step 1550. At step 1555, it is determined whether the capturing input signal can be routed through any of the available multiplexors. If the capturing input signal can be routed, the flow continues at step 1530. If the capturing signal cannot be routed, the blocked signal is replaced with the capturing signal at step 1560. Thus, a reverse swap occurs.

At step 1565, it is determined whether all of the multiplexors capable of routing the blocked input signal have been checked for swapping. If not, the next multiplexor capable of routing the blocked input signal is selected at step 1570, and the process continues at step 1545. If all multiplexors capable of routing the blocked input signal have been checked for swapping, the router returns a value indicating unsuccessful routing at step 1575.

The depth value becomes significant after swaps occur. As the number of swaps performed in the routing process increases, the likelihood that the particular combination of input signals cannot be routed is increased. The maximum depth value MAXDEPTH allows the number of swaps to be limited and provides a mechanism for ending the iterative process. Step 1512 provides for aborting the routing process if the depth value is equal to the maximum depth value, even if successful swapping has occurred.

FIGS. 15, 16A, 16B, 16C, 16D, and 16E are now discussed in combination to provide a comparison between the present programming method and the programming method of FIG. 12. At step 1505, the router receives input data indicating that a combination of the input signals 16, 15, 14, 2, 3, 6, 8, and 9 are to be routed through the PIM 500. Input signals 16, 15, 14, 2, 3, and 6 capture multiplexors 550, 540, 560, 510, 520, and 530, respectively. The router attempts to route input signal 8 by selecting each of the multiplexors 510, 520, 530, and 540, but none of the multiplexors are available, and input signal 8 is blocked.

Figure 16A:
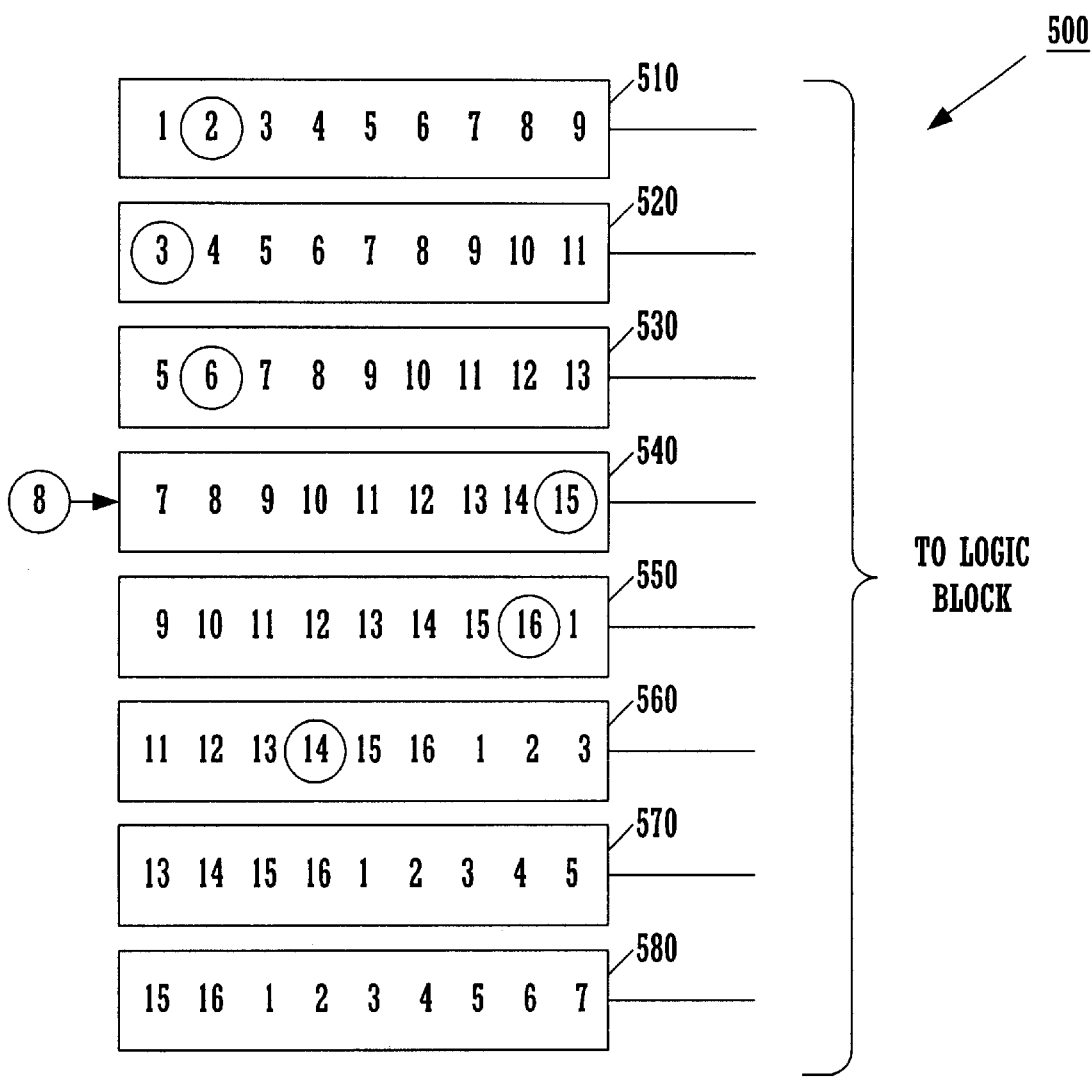
FIG. 16A shows the routing of input signals through a PIM using the routing of method shown in FIGS. 15A–15B.
Figure 16B:
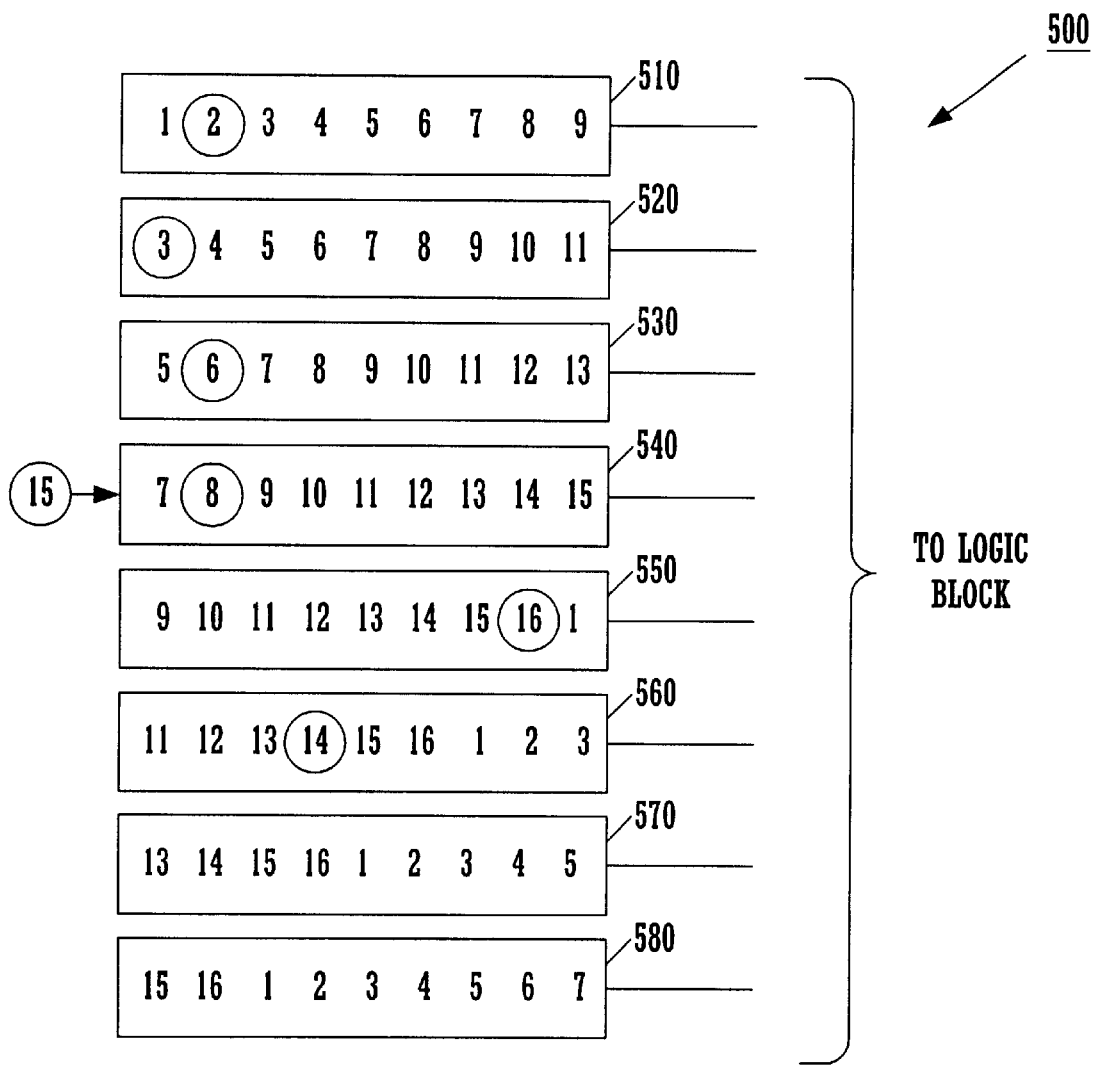
FIG. 16B continues the example of FIG. 16A.

The routing of input signal 8 is blocked because there are no multiplexors available to route input signal 8. This is shown in FIG. 16A. Assuming that the currently selected multiplexor is multiplexor 540, the blocked input signal 8 is swapped with the capturing input signal 15 at step 1545. This is shown in FIG. 16B. At step 1550, the depth value is incremented by one. At step 1555, it is determined that the capturing input signal may be rerouted through multiplexor 570. The flow continues at step 1530. Input signals remain to be routed, and input signal 9 is next selected for routing.

Figure 16C:
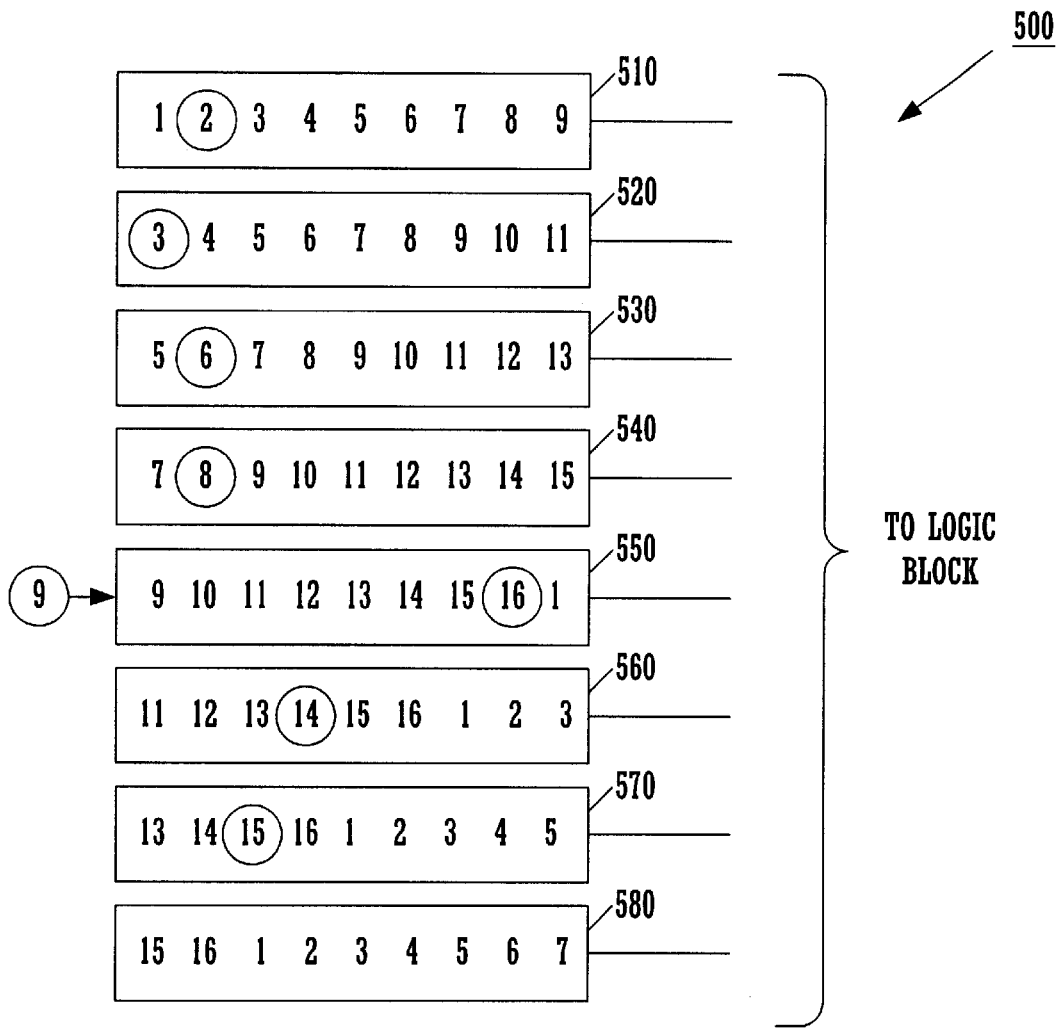
FIG. 16C continues the example of FIG. 16A.
Figure 16D:
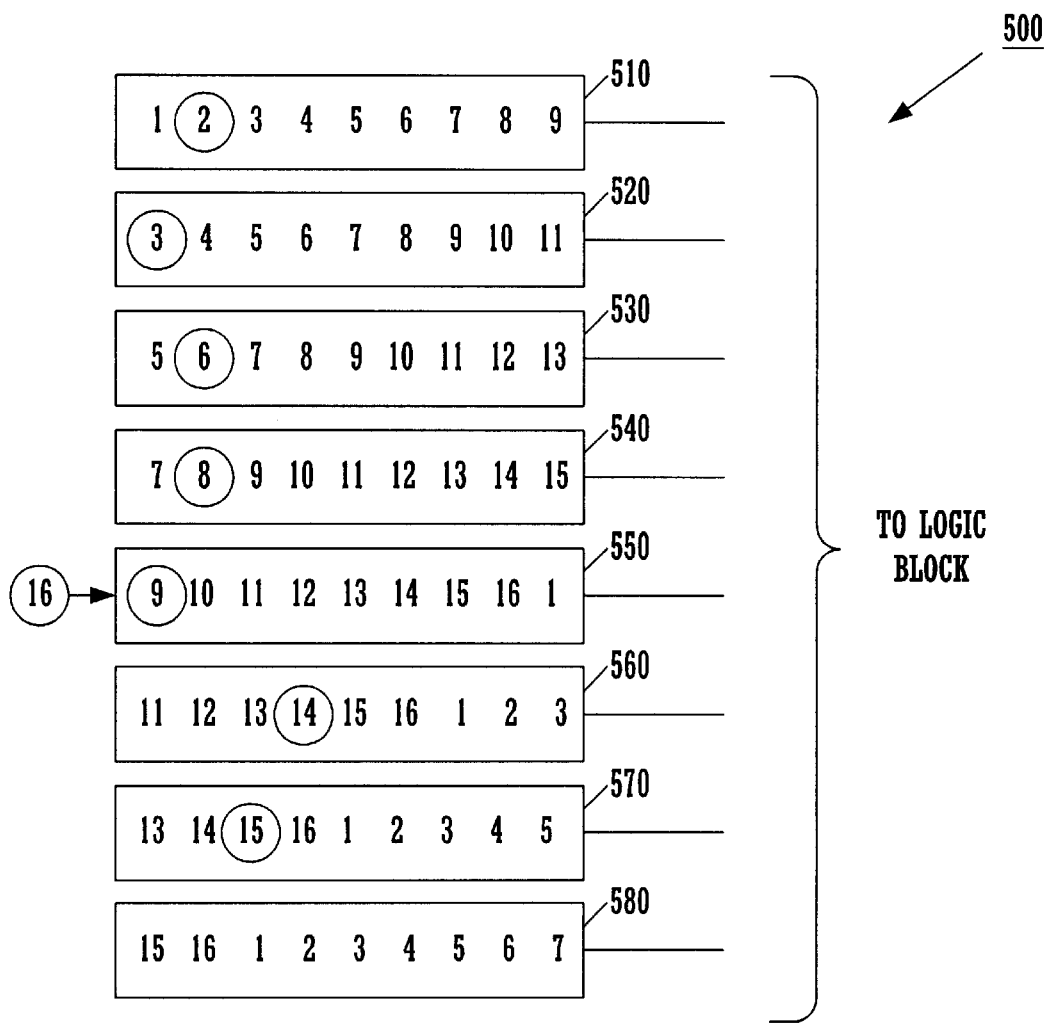
FIG. 16D continues the example of FIG. 16A.
Figure 16E:
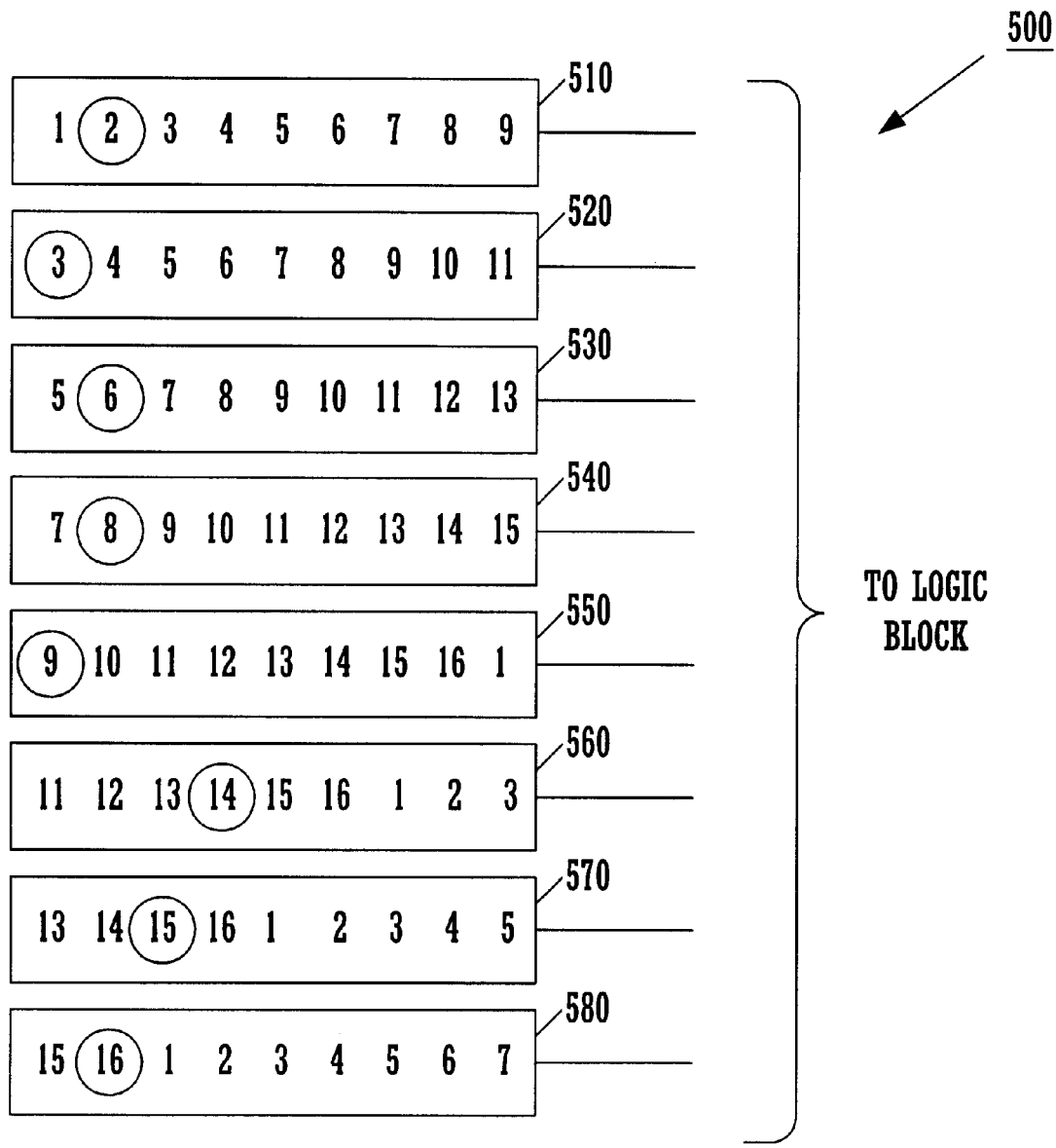
FIG. 16E continues the example of FIG. 16A.

Input signal 9 is also blocked. This is shown in FIG. 16C. Assuming that the currently selected multiplexor is multiplexor 550, blocked input signal 9 is swapped with capturing input signal 16 at step 1545. This is shown in FIG. 16D. At step 1555, it is determined that capturing input signal 16 can be rerouted through multiplexor 580. No input signals remain to be routed, and the router returns a value indicating that the combination of input signals is successfully routed. The final route of the combination of input signals is shown in FIG. 16E. The route is identical to that shown in FIG. 14.

Figure 17A:
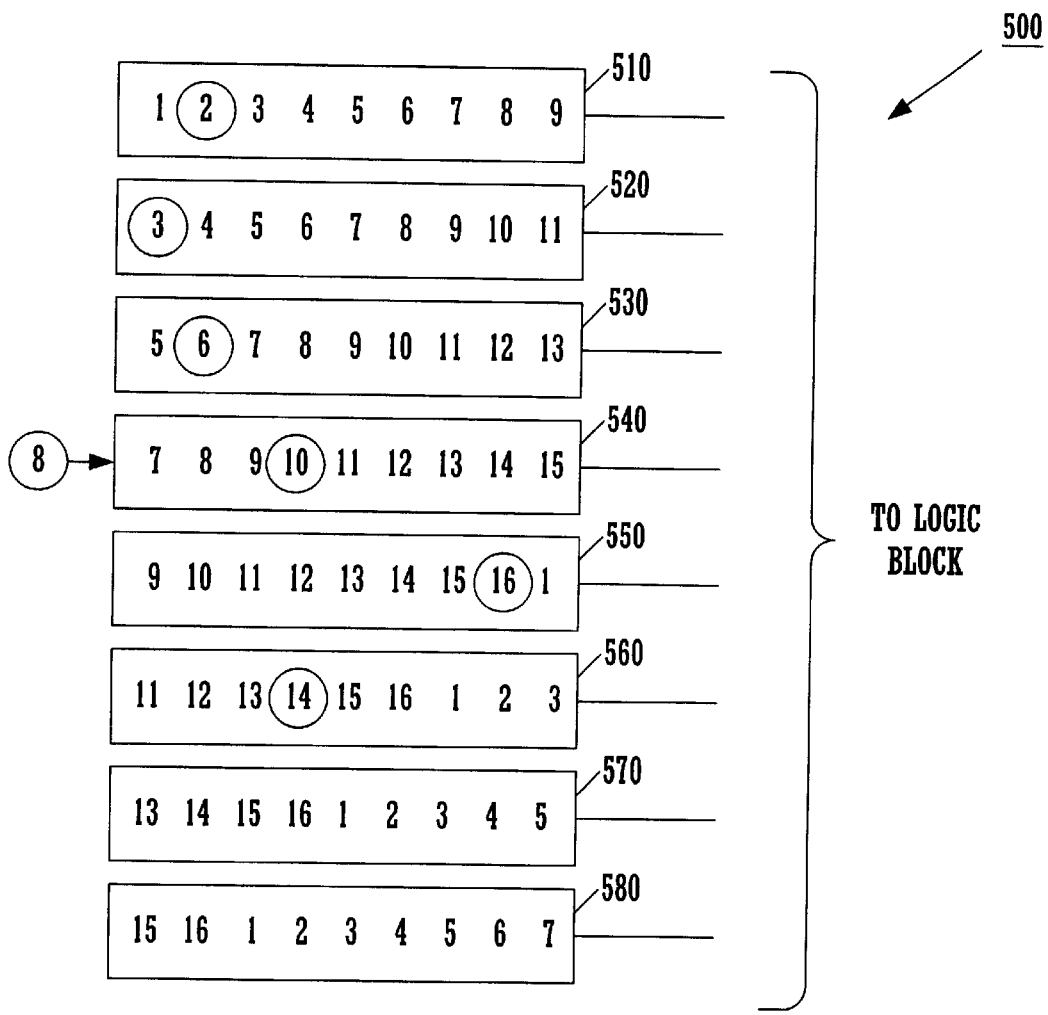
FIG. 17A shows another example of routing input signals through a PIM using the routing of method shown in FIGS. 15A–15B.

FIGS. 17A, 17B, 17C, 17D and 17E show a second example of routing a combination of input signals through the PIM 500 using the method shown in FIGS. 15A–15B. The routing method of FIGS. 15A–15B is an iterative process and may require a number of swaps and "unswaps" to correctly provide the appropriate routing of the combination of input signals. The combination of input signals is 16, 2, 3, 6, 10, 14, 8, and 7. Input signals 16, 2, 3, 6, 10, and 14 capture multiplexors 550, 510, 520, 530, 540, and 560, respectively. Input signal 8 is blocked. This is shown in FIG. 17A

Figure 17B:
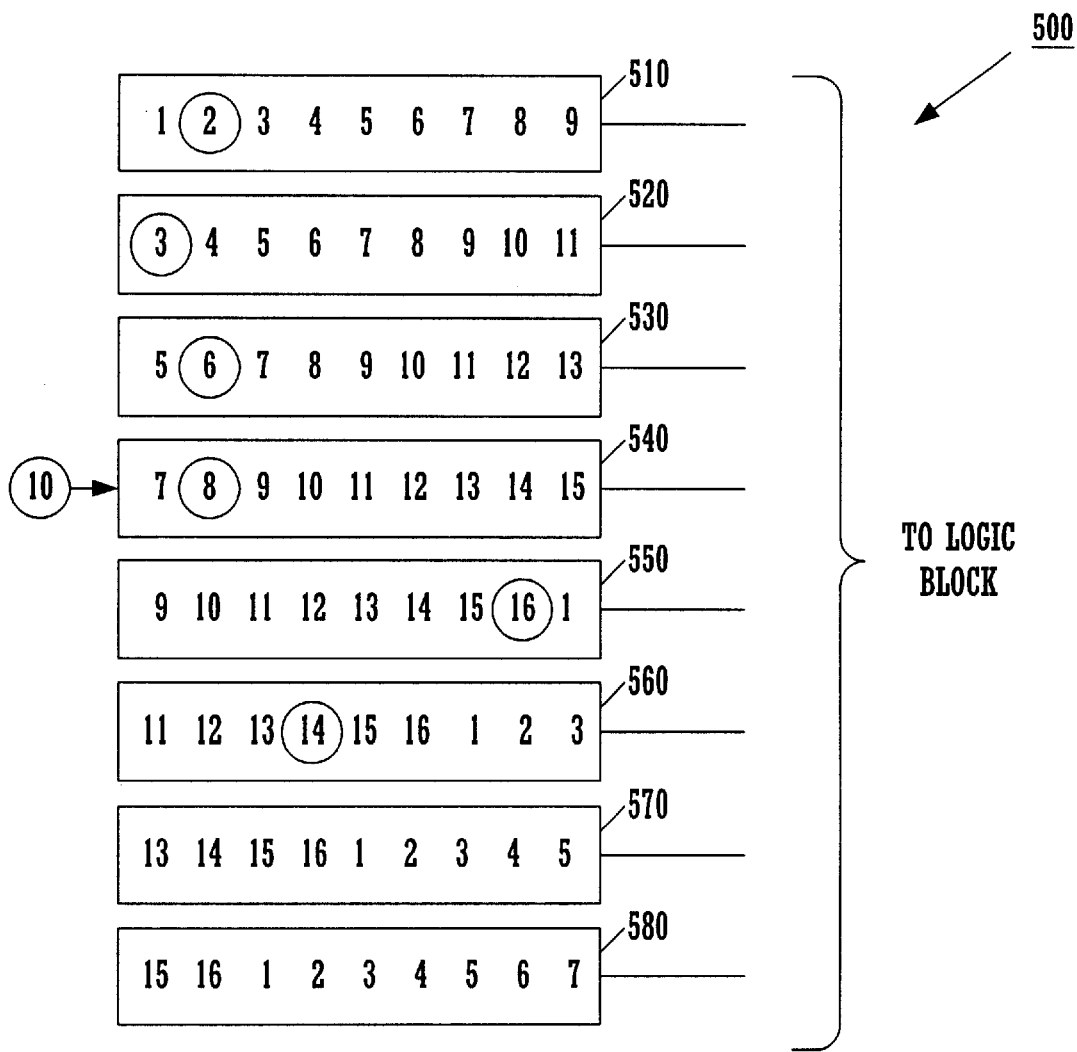
FIG. 17B continues the example of FIG. 17A.
Figure 17C:
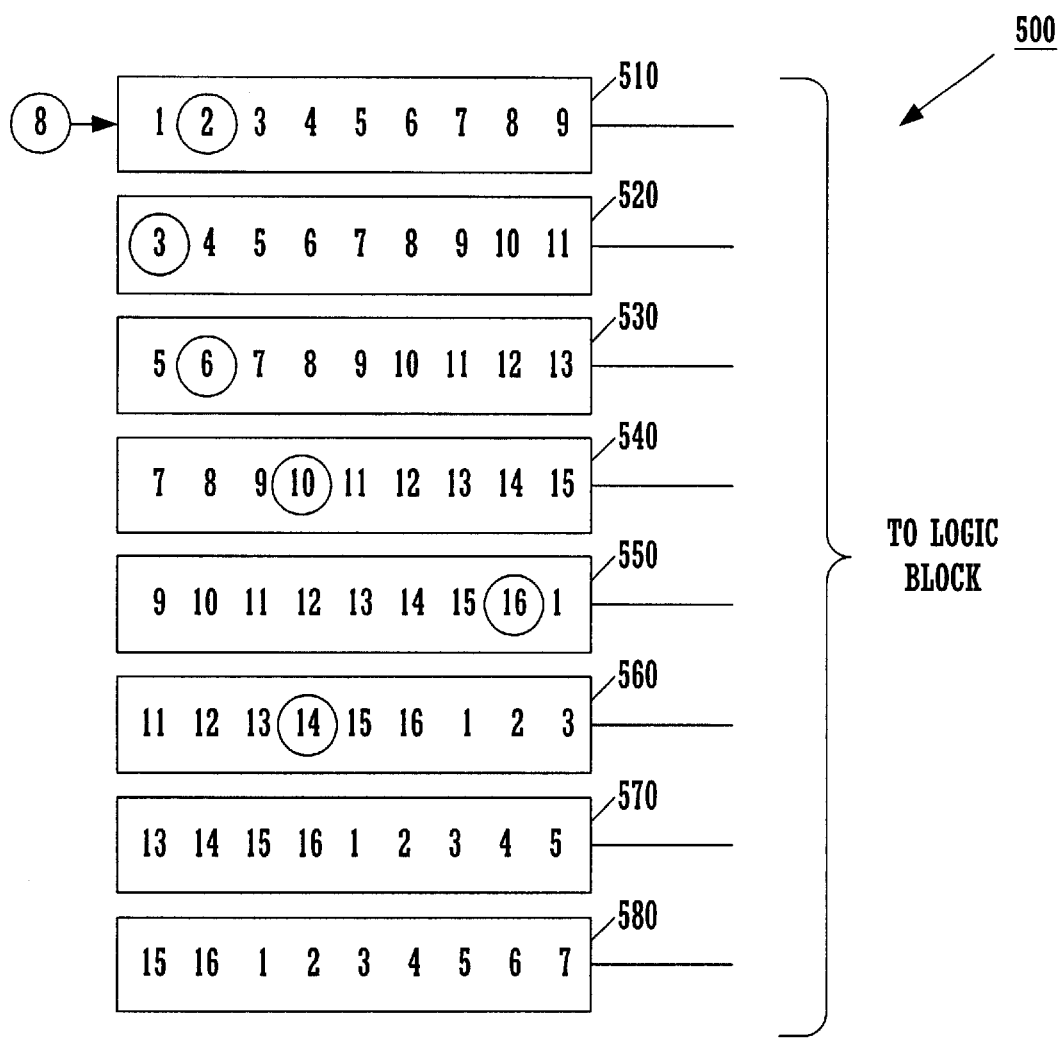
FIG. 17C continues the example of FIG. 17A.
Figure 17D:
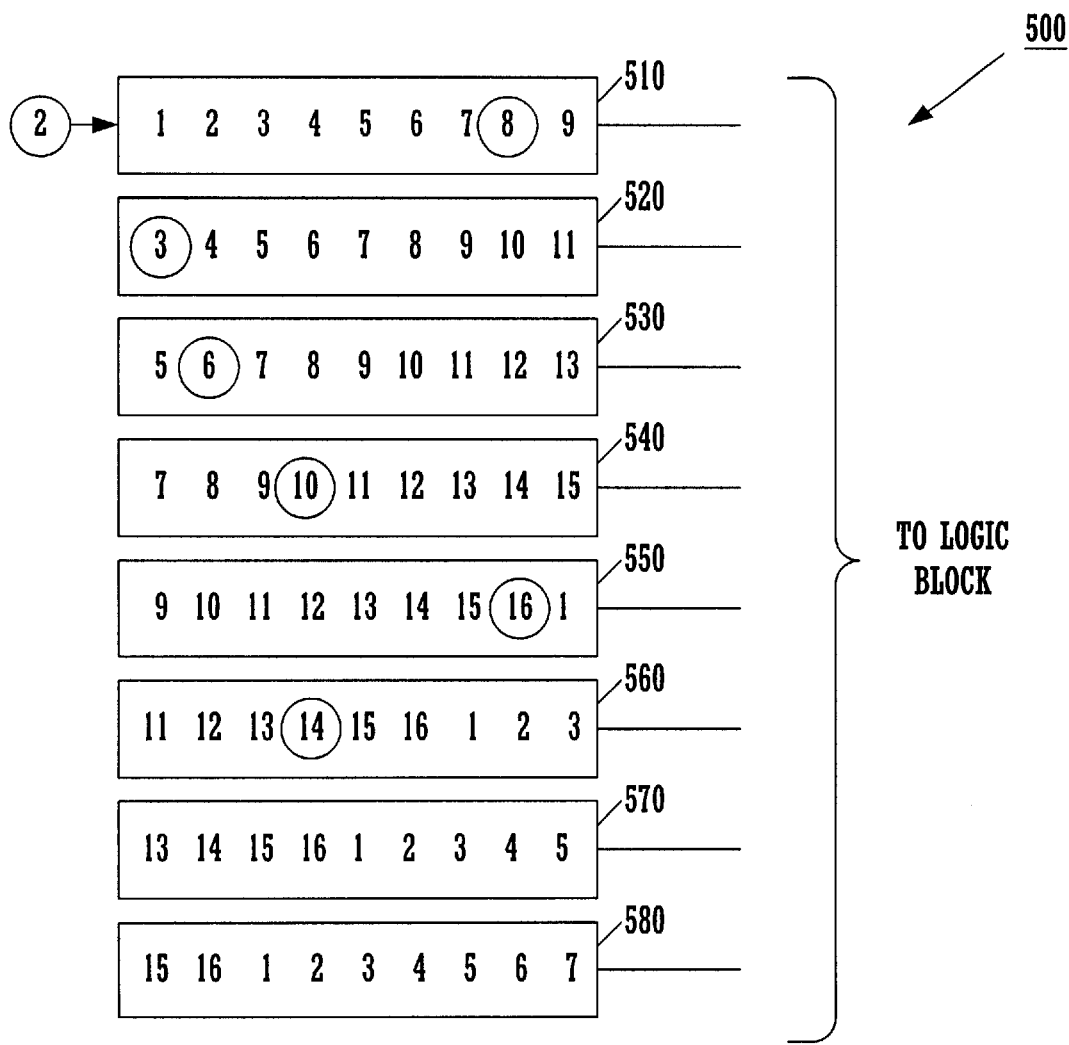
FIG. 17D continues the example of FIG. 17A.
Figure 17E:
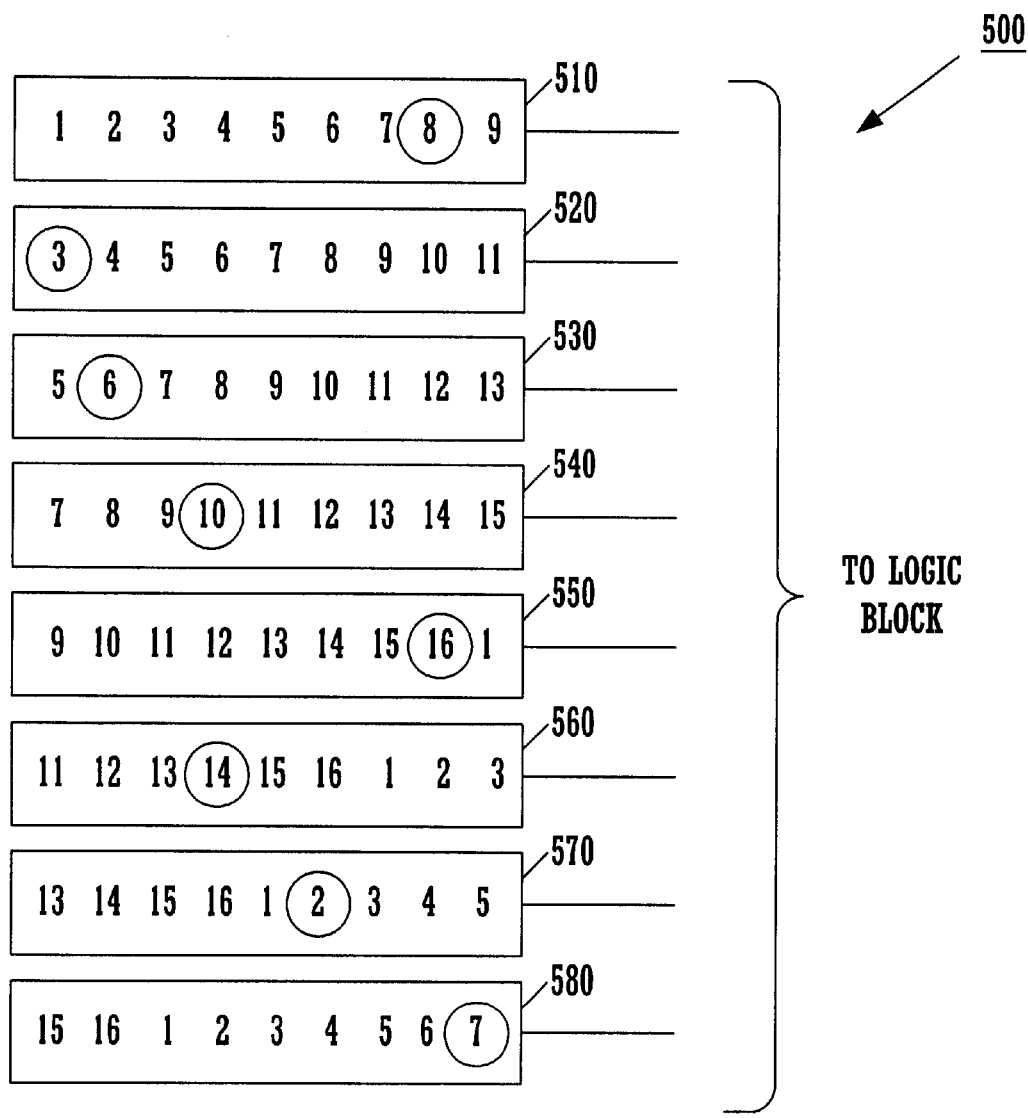
FIG. 17E continues the example of FIG. 17A.

Blocked input signal 8 is first swapped with capturing input signal 10 at multiplexor 540. This is shown in FIG. 17B. The router attempts to reroute capturing input signal 10, but there are no available multiplexors for routing capturing input signal 10. A reverse swapping operation occurs wherein capturing input signal 10 is again routed through multiplexor 540. This is shown in FIG. 17C. The router next swaps the blocked input signal 8 with the capturing signal 2 of multiplexor 510. This is shown in FIG. 17D. The router attempts to reroute capturing input signal 2 and determines that multiplexor 570 is available. Capturing input signal 2 is rerouted to multiplexor 570 and the remaining input signal 7 is routed to multiplexor 580. This is shown in FIG. 17E. The router indicates that the desired combination of input signals has been successfully routed.

Figure 18A:
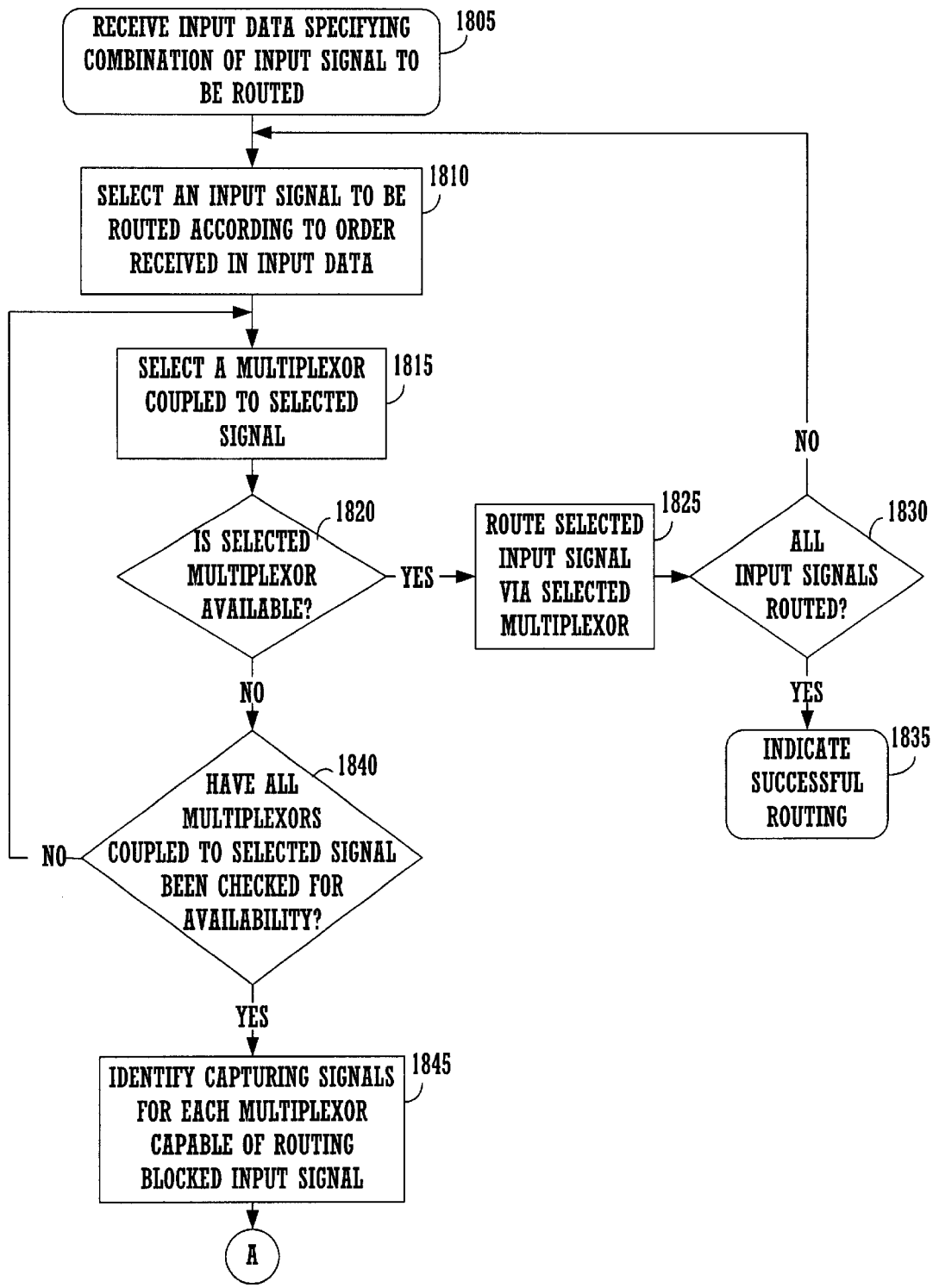
FIG. 18A is a flow chart showing a predictive routing method according to another embodiment.
Figure 18B:
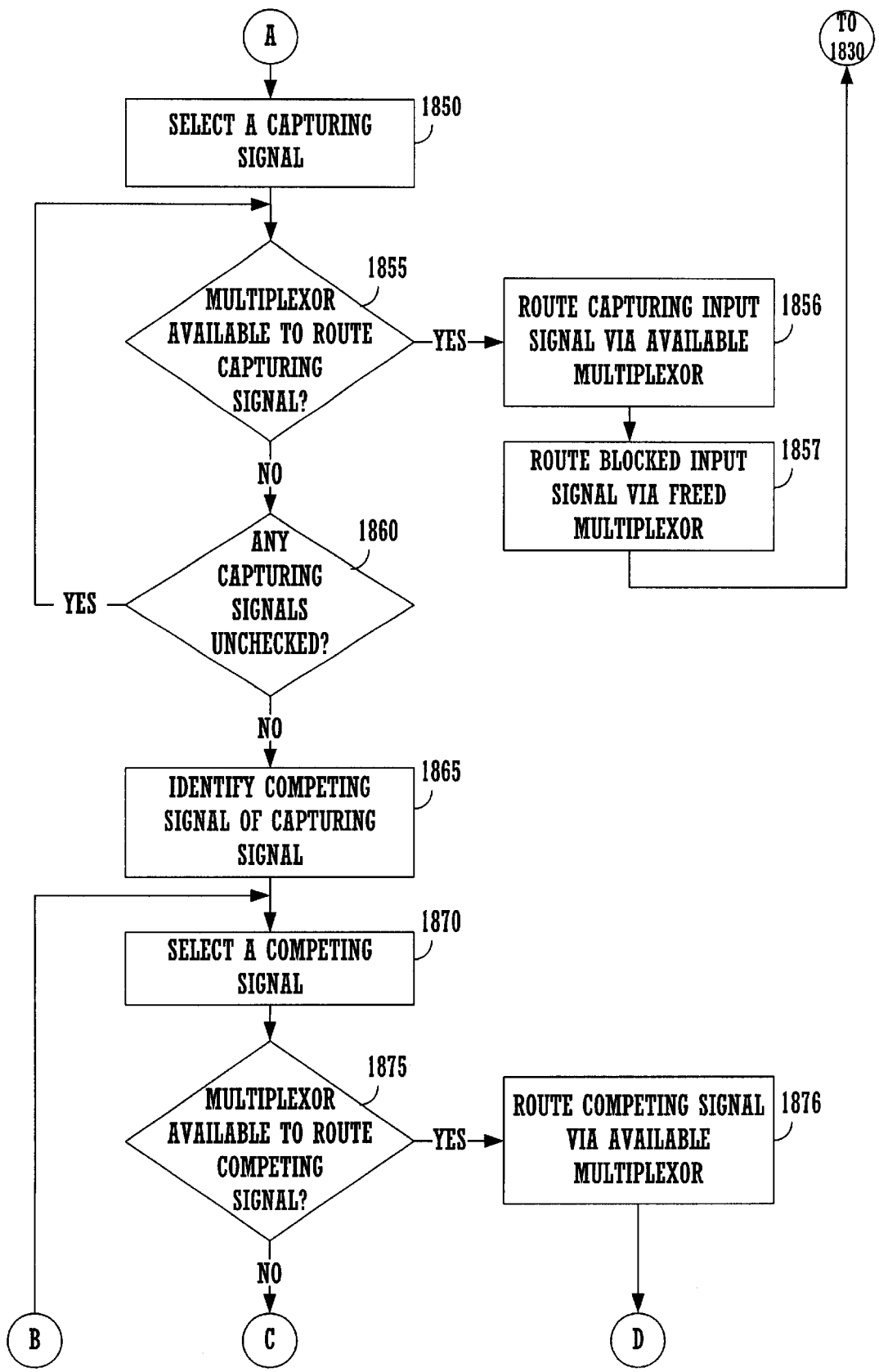
FIG. 18B continuest the flow chart of FIG. 18A.
Figure 18C:
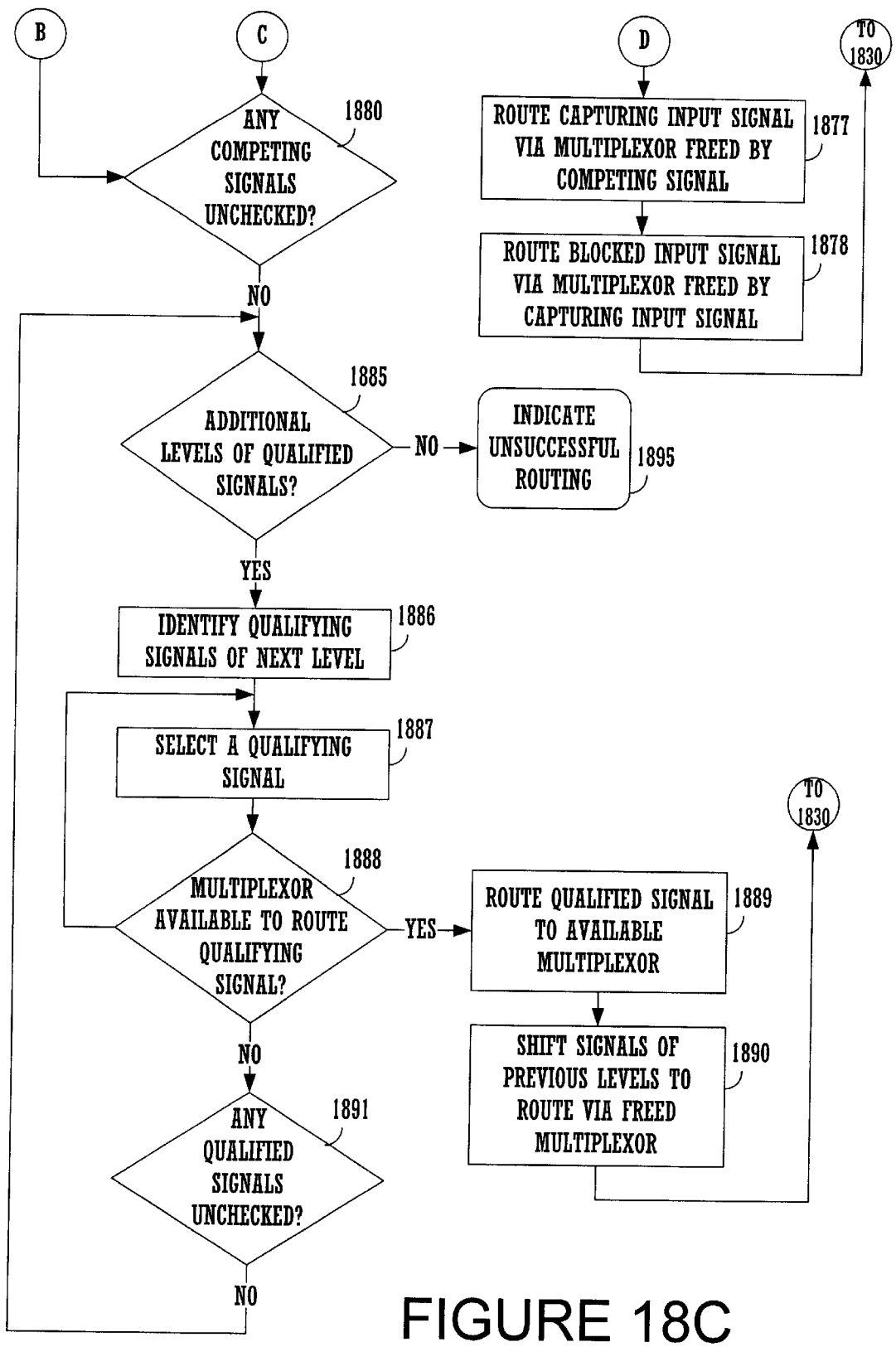
FIG. 18C continuest the flow chart of FIG. 18A.

For some applications it may be desirable to have a predictive routing method that determines the outcome of a potential swap prior to making the swap. FIGS. 18A, 18B, and 18C show a flow chart demonstrating a predictive routing method. The predictive programming method implicitly divides the set of input signals into a number of different levels of signals that are qualified for rerouting to provide a route for a blocked input signal. The first level of qualified signals are the capturing input signals that are routed through the set of multiplexors that are otherwise capable of routing the blocked input signal. The second level of qualified signals are those input signals that compete with the capturing input signals and that are routed through multiplexors that are otherwise capable of routing the capturing input signals. The second level of qualified input signals are referred to as "competing signals." The next level of qualified signals are those input signals that compete with the competing signals and that are routed through multiplexors that are otherwise capable of routing the competing signals. Depending on the complexity of the PIM, there may be many more levels of qualified signals. Each successive level of qualified input signals are those input signals that are routed through a multiplexor that can otherwise route a signal from the previous level of qualified input signals.

The predictive routing method tests each capturing input signal of the first level to determine if an available multiplexor can route the capturing input signal should the capturing input signal be freed. If an available multiplexor can route the capturing input signal, the capturing input signal is rerouted to the available multiplexor and the blocked input signal is routed through the freed multiplexor. If there are no available multiplexors to reroute any of the capturing input signals, each competing signal of the second level is tested to determine if an available multiplexor can route the competing input signal. If an available multiplexor can route the competing input signal, the competing signal is rerouted to the available multiplexor, the capturing signal is rerouted to the multiplexor freed by the rerouting of the competing signal, and the blocked signal is routed to the multiplexor freed by the rerouted capturing signal. If there are no available multiplexors to reroute any of the competing input signals, each competing signal of the second level is tested to determine if an available multiplexor can route the next level of qualified input signals. The process continues until all levels of qualified input signals have been tested or the combination of input signals has been successfully routed.

At step 1805, the router receives input data that indicates which input signals are to be routed. A user determines the particular combination of input signals and delivers the combination as input data to the router. The input signals are sequentially routed in the order corresponding to their order in the input data. At step 1810, the next input signal contained in the sequence of the input data is selected for routing through the PIM. At step 1815, the router selects a multiplexor that is coupled to the selected input signal. At step 1820, the router determines whether the selected multiplexor is available for routing the selected input signal or if the selected multiplexor has been otherwise captured for routing another input signal of the combination. If the selected multiplexor is available, the selected input signal is routed through the selected multiplexor at step 1825. The selected multiplexor thus becomes unavailable for routing subsequent input signals. At step 1830, it is determined whether all of the input signals of the combination are be routed. If all the input signals of the combination are routed, the router returns a value indicating successful routing at step 1835. If one or more input signals remains to be routed, the next input signal in the sequence is chosen at step 1810, and steps 1815 and 1820 are repeated.

If the selected multiplexor is not available at step 1820, it is determined whether all multiplexors to which the selected signal is coupled have been checked for availability at step 1840. Steps 1815, 1820, and 1840 are repeated until an available multiplexor is found or until all multiplexors have been determined to be unavailable at step 1840. If no multiplexors are available for routing the blocked input signal, the router identifies the input signals that have captured the multiplexors and that are otherwise capable of routing the blocked input signal at step 1845.

The flow chart continues at FIG. 18B. Once all of the capturing input signals of the first level of qualified input signals are identified, a capturing signal is selected for testing at step 1850. At step 1855, the router determines if a multiplexor is available to reroute the capturing input signal. If a multiplexor is available, the capturing signal is rerouted to the available multiplexor at step 1856, thus freeing the multiplexor previously captured by the capturing input signal. The blocked input signal is routed to the freed multiplexor at step 1857, and the process continues at step 1830.

If no multiplexors are available for routing the selected capturing input signal, it is determined at step 1860 whether any capturing input signals of the first level of qualified input signals remain to be checked by step 1855. If capturing input signals remained to be tested, steps 1850 and step 1855 are repeated until a capturing input signal is rerouted or there are no capturing signals that have not been tested.

If all the capturing input signals of the first level of qualified input signals have been tested, the competing signals of the second level of qualified input signals are identified at step 1865, and testing of the competing signals begins at step 1870, wherein the next competing input signal is selected for testing. At step 1875, the router determines if a multiplexor is available to reroute the capturing input signal. If a multiplexor is available, the competing signal is rerouted to the available multiplexor at step 1876, thus freeing the multiplexor previously captured by the competing input signal. The captured input signal is rerouted to the freed multiplexor at step 1877, thus freeing the multiplexor previously captured by the capturing input signal. The blocked signal is routed to the multiplexor previously captured by the capturing signal, and the process continues at step 1830.

The flow chart continues in FIG. 18C. If no multiplexors are available for routing the selected capturing input signal, it is determined at step 1880 whether any competing input signals of the second level of qualified input signals remain to be checked by step 1875. If capturing input signals remained to be tested, steps 1870 and step 1875 are repeated until a competing input signal is rerouted or there are no competing signals that have not been tested.

The process continues at step 1885, where it is determined whether any additional levels of qualified input signals remain. If there are additional levels of qualified input signals, the qualified input signals of the next level are identified at step 1886, and a qualified input signal is selected for testing at step 1887. It is determined whether there any multiplexors available to route the qualified input signal at step 1888. If the qualified input signal can be rerouted, it is rerouted at step 1889 and the qualified signals of the previous levels of qualified input signals are shifted in the same manner described above such that the blocked input signal can be routed by the multiplexor freed by the rerouted capturing input signal. This occurs at step 1890. If there are no multiplexors available to reroute the qualified input signal, the router determines if there are any further qualified input signals of the present level to be tested. This occurs at step 1890. If there are more qualified input signals of the present level to be tested, steps 1887 and 1888 are repeated until a qualified input signal is rerouted or there are no further qualified input signals of the present level to be tested, at which point step 1885 is repeated to determine if there are additional levels of qualified input signals. If there are no additional levels of qualified input signals, the router returns a value indicating the unsuccessful routing of the combination of input signals.

Figure 19A:
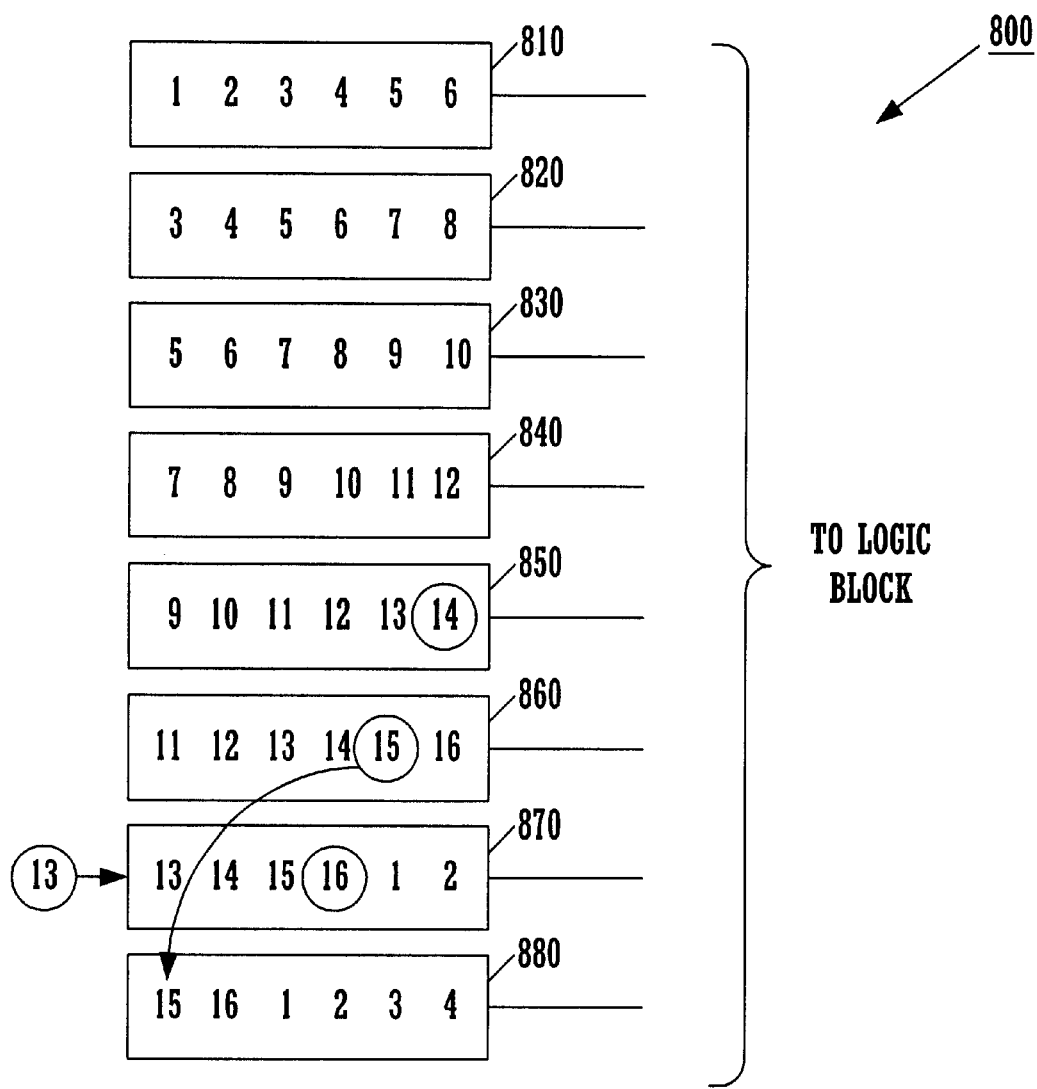
FIG. 19A shows the routing of input signals through a PIM using the routing of method shown in FIGS. 18A–18C.
Figure 19B:
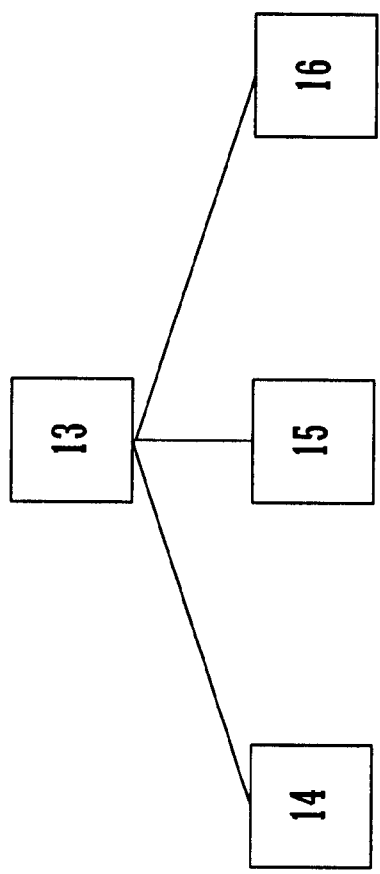
FIG. 19B continues the example of FIG. 19A.
Figure 19C:
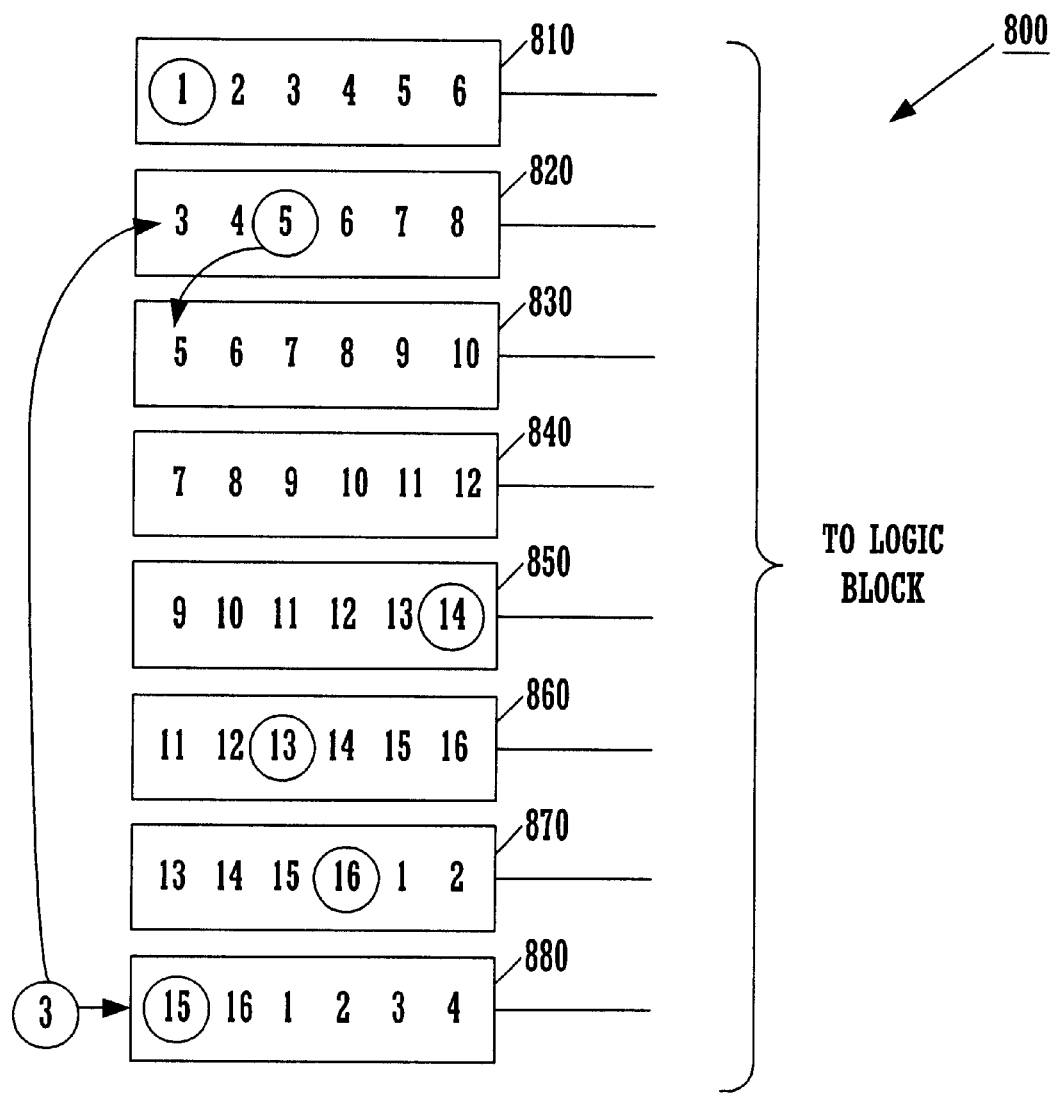
FIG. 19C continues the example of FIG. 19A.

FIGS. 19A, 19B, and 19C show an application of the predictive programming method of FIGS. 18A–18C. The router receives a combination of input signals including input signals 14, 15, 16, 13, 1, 5, 3, and 11. Input signals 14, 15, and 16 are sequentially routed to multiplexors 850, 860, and 870, respectively. This shown in FIG. 19A. The next input signal in the combination is input signal 13, but there are no available multiplexors. Input signal 13 is therefore blocked.

Relative to the blocked input signal 13, the input signals 14, 15, and 16 are capturing signals of the first level of signals qualified for rerouting to accommodate the routing of the blocked input signal. FIG. 19B is a diagrammatic view showing this relationship between the blocked input signals and the capturing input signals. The single box containing the number 13 at the top of the figure represents the blocked input signal 13. The three boxes containing the numbers 14, 15, and 16, respectively, represent the capturing input signals that have captured the three multiplexors that are capable of routing the blocked input signal 13. These three signals are the first level of qualified signals that can allow the routing of the blocked input signal. The capturing input signal 14 is selected for testing first. Testing reveals no available multiplexors for rerouting the capturing input signal 14. The capturing input signal 15 is next tested, and the testing indicates that the capturing input signal 15 can be rerouted to multiplexor 880, freeing multiplexor 860 to route the blocked input signal 13.

Figure 19D:
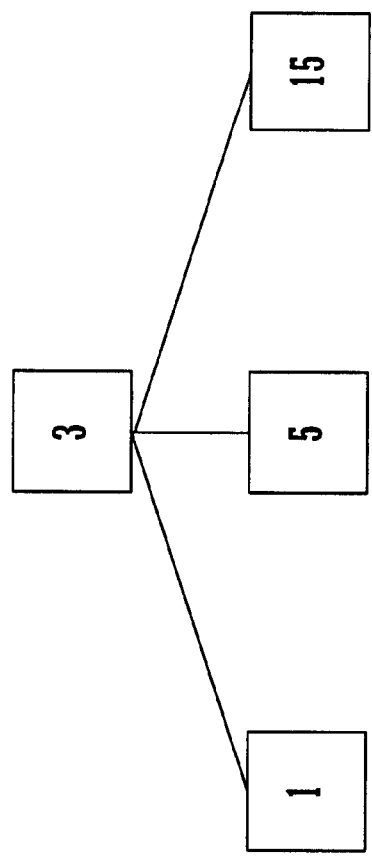
FIG. 19D continues the example of FIG. 19A.
Figure 19E:
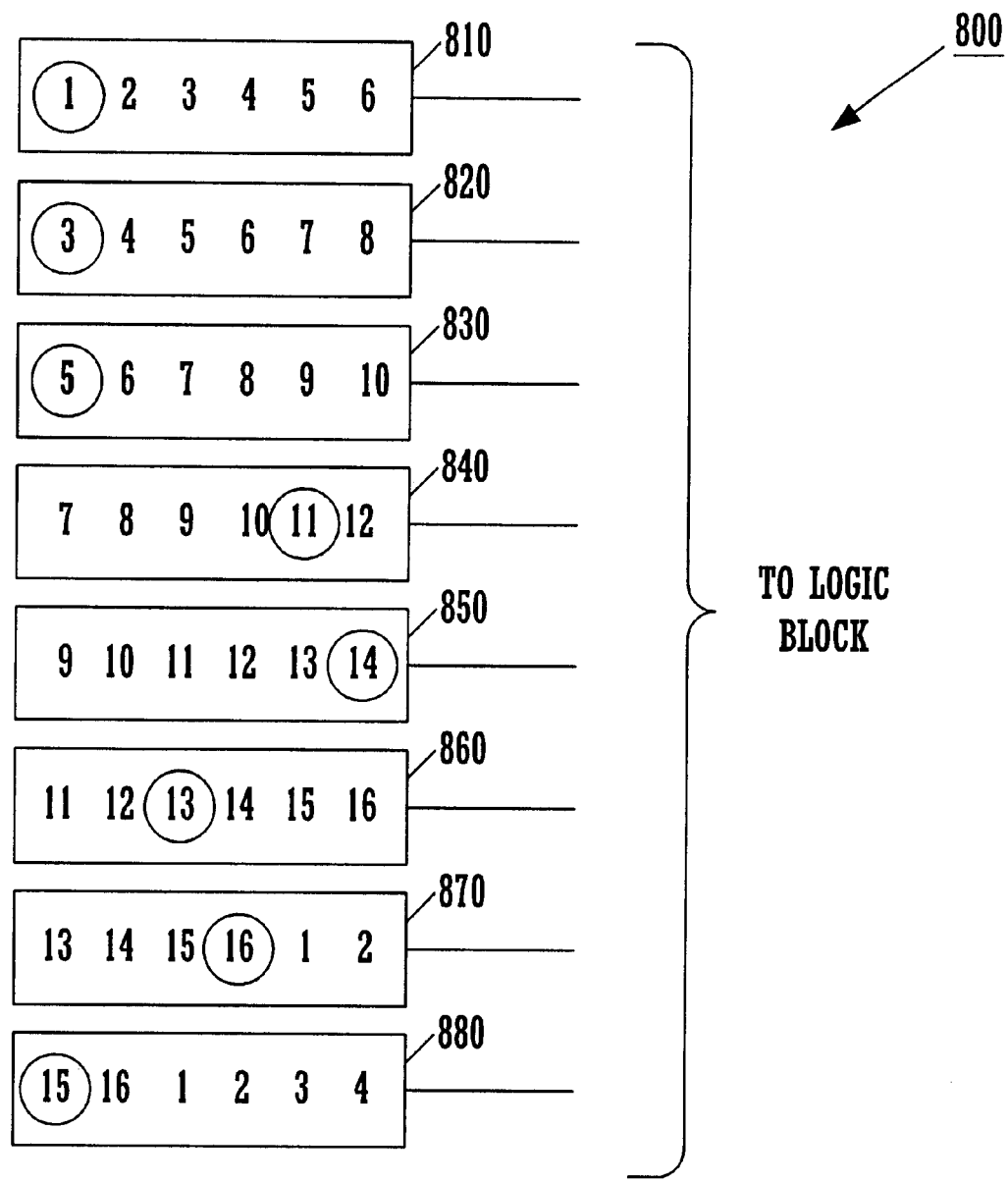
FIG. 19E continues the example of FIG. 19A.

Input signals 1 and 5 are successfully routed to multiplexors 810 and 820, respectively. The routing of input signals to multiplexors at this point is shown in FIG. 19C. Input signal 3 is blocked. As shown in FIG. 19D, the first level of qualified signals for blocked input signal 3 include capturing signals 1, 5, and 15, which are routed through multiplexors 810, 820, and 880, respectively. Again, capturing input signal 14 cannot be rerouted at this level. Capturing input signal 5, however, can be rerouted to multiplexor 830. Capturing input signal 5 is rerouted to multiplexor 830, freeing multiplexor 820 to route blocked input signal 3. Input signal is successfully routed to multiplexor 840, and the combination of input signals is entirely routed by the PIM. This is shown in FIG. 19E.

Figure 20A:
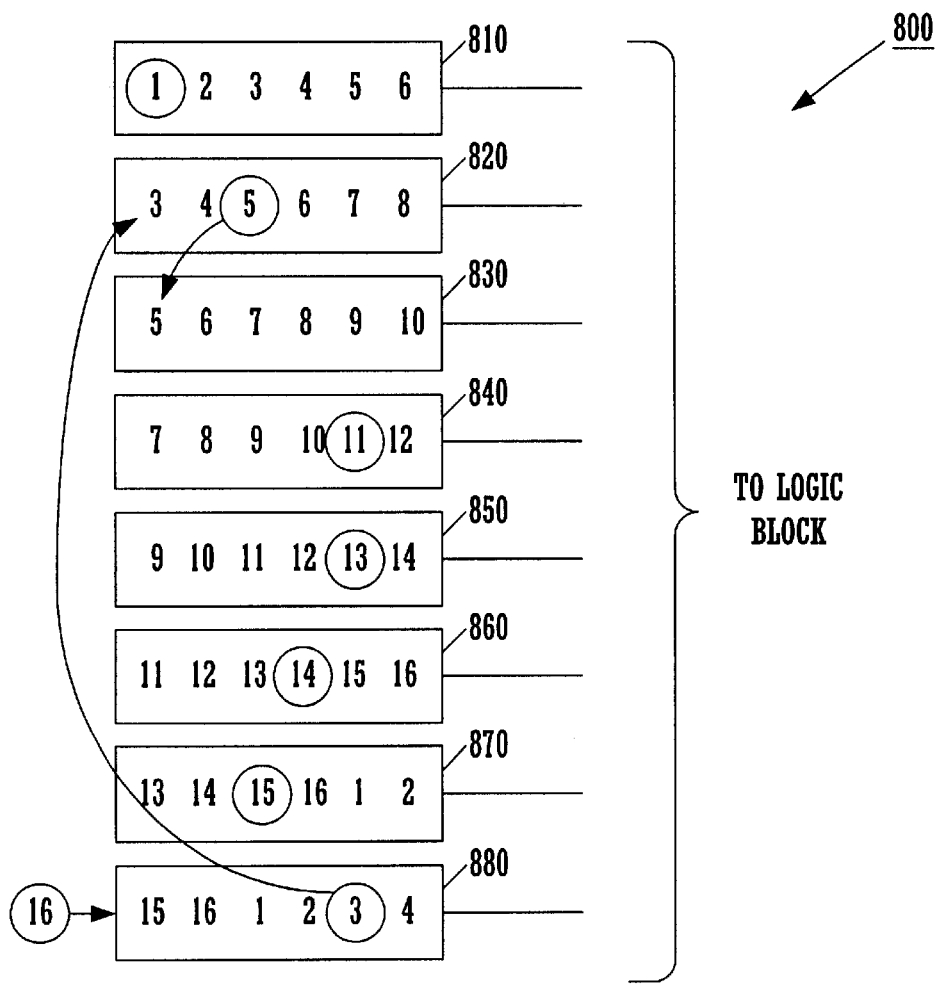
FIG. 20A shows another example of routing input signals through a PIM using the routing of method shown in FIGS. 18A–18C.
Figure 20B:
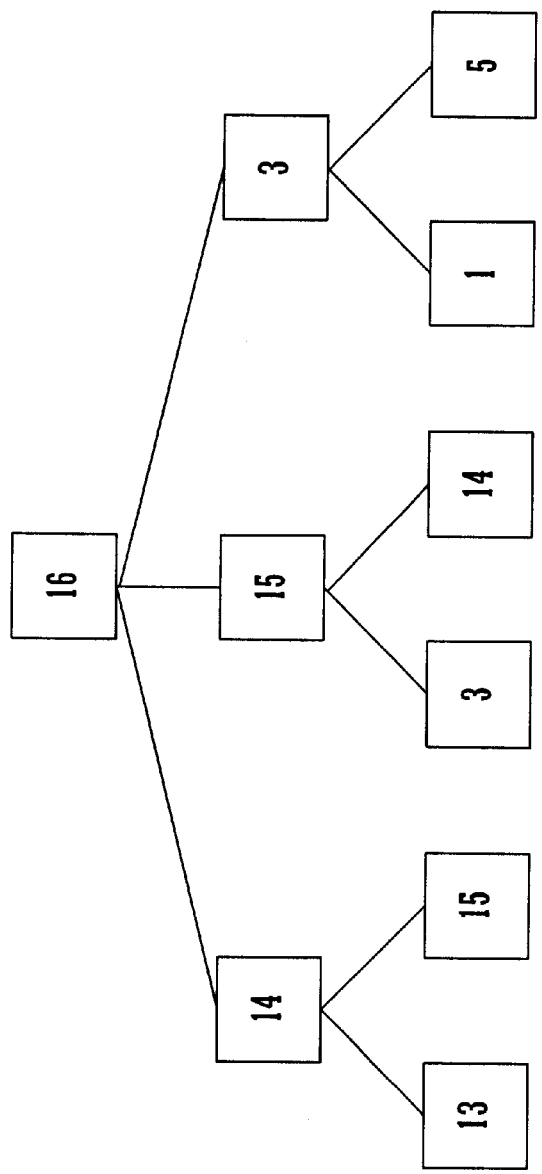
FIG. 20B continues the example of FIG. 20A.
Figure 20C:
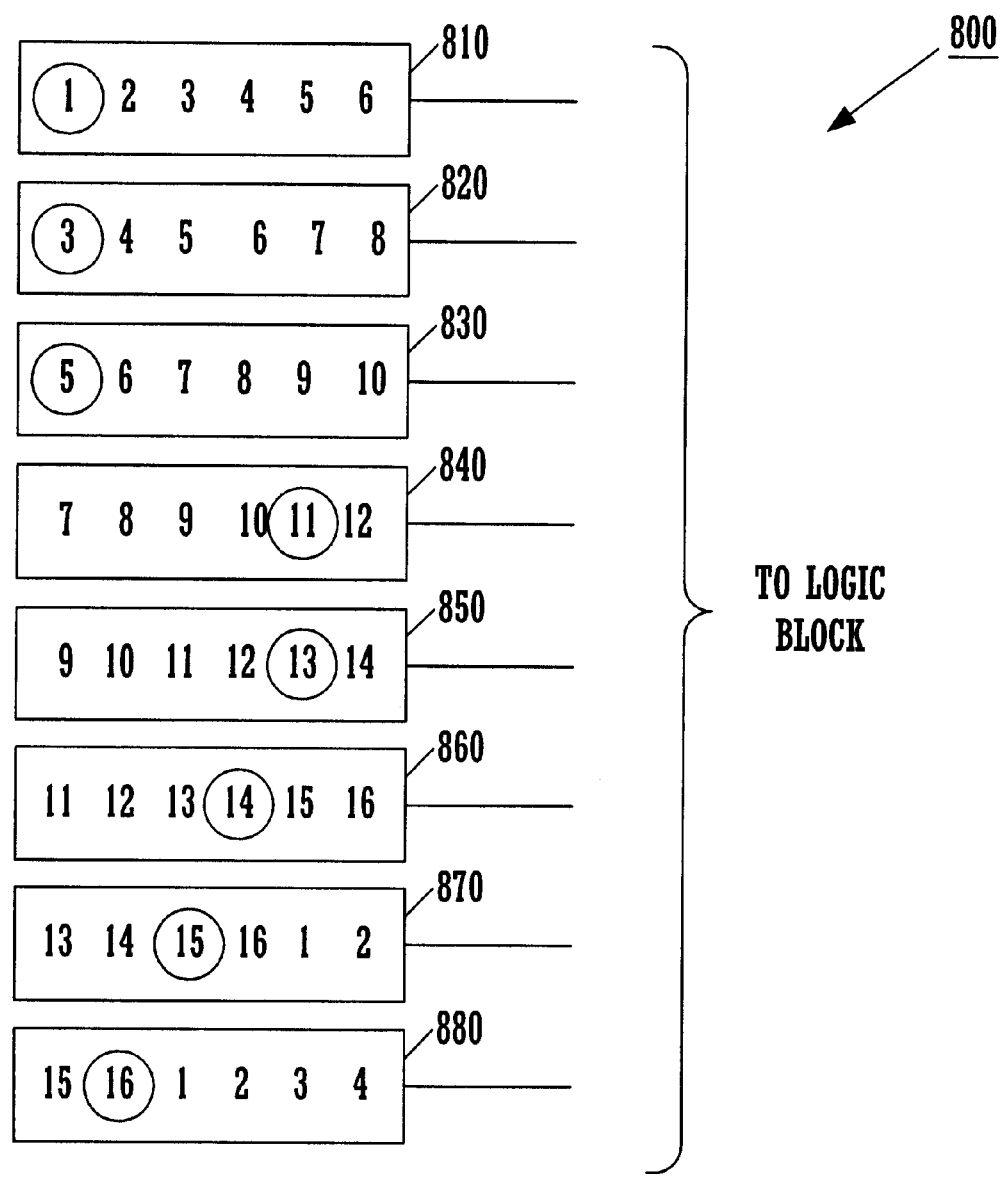
FIG. 20C continues the example of FIG. 20A.

A more complicated example is shown in FIGS. 20A, 20B, and 20C. The combination of input signals for this example includes input signals 13, 14, 15, 1, 5, 2, 11, and 16. As shown in FIG. 20A, input signals 13, 14, 15, 1, 5, 3, and 11 are sequentially routed to multiplexors 850, 860, 870, 810, 820, 880, and 840, respectively. Input signal 16 is blocked.

FIG. 20B shows that the first level of qualified input signals include input signals 14, 15, and 3. There are no multiplexors available to reroute these capturing signals at this level. The competing signals of the second level of qualified signals are shown as including input signals 13, 14, 15, 1, 3, and 5. Each competing signal is indicated as competing with the appropriate capturing signal of the first level of qualified input signals. As may be seen from FIG. 20A, multiplexor 830 is available for rerouting competing input signal 5. Competing input signal 5 is rerouted to multiplexor 830, capturing input signal 3 is rerouted to multiplexor 820, and blocked input signal 16 is routed to multiplexor 880. This is shown in FIG. 20C.

Figure 21A:
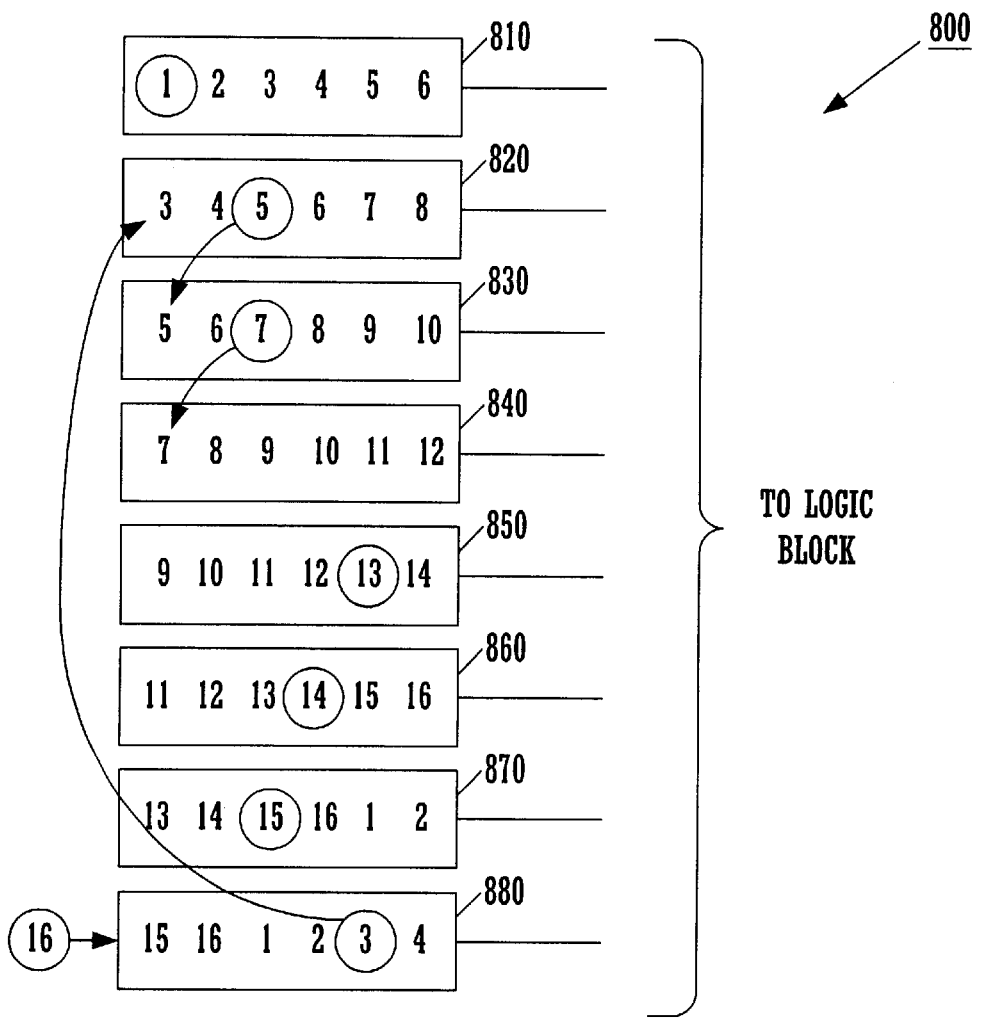
FIG. 21A shows another example of routing input signals through a PIM using the routing of method shown in FIGS. 18A–18C.
Figure 21B:
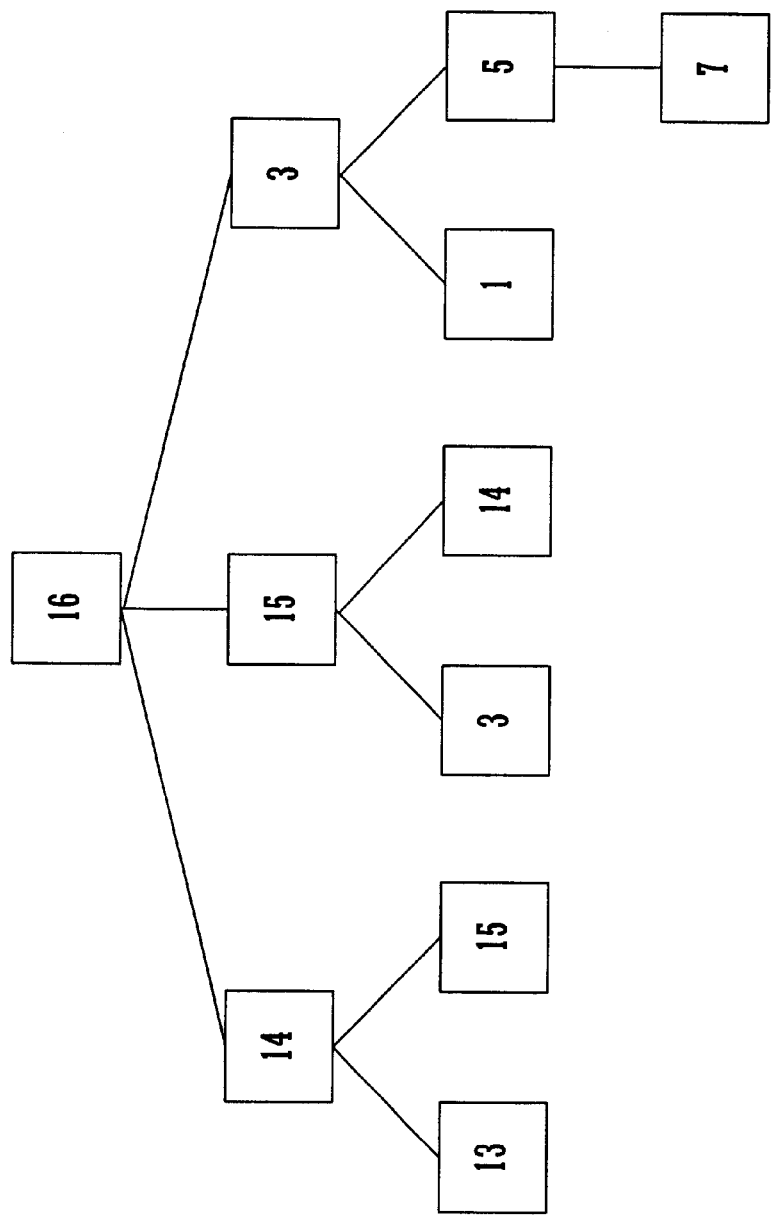
FIG. 21B continues the example of FIG. 21A.
Figure 21C:
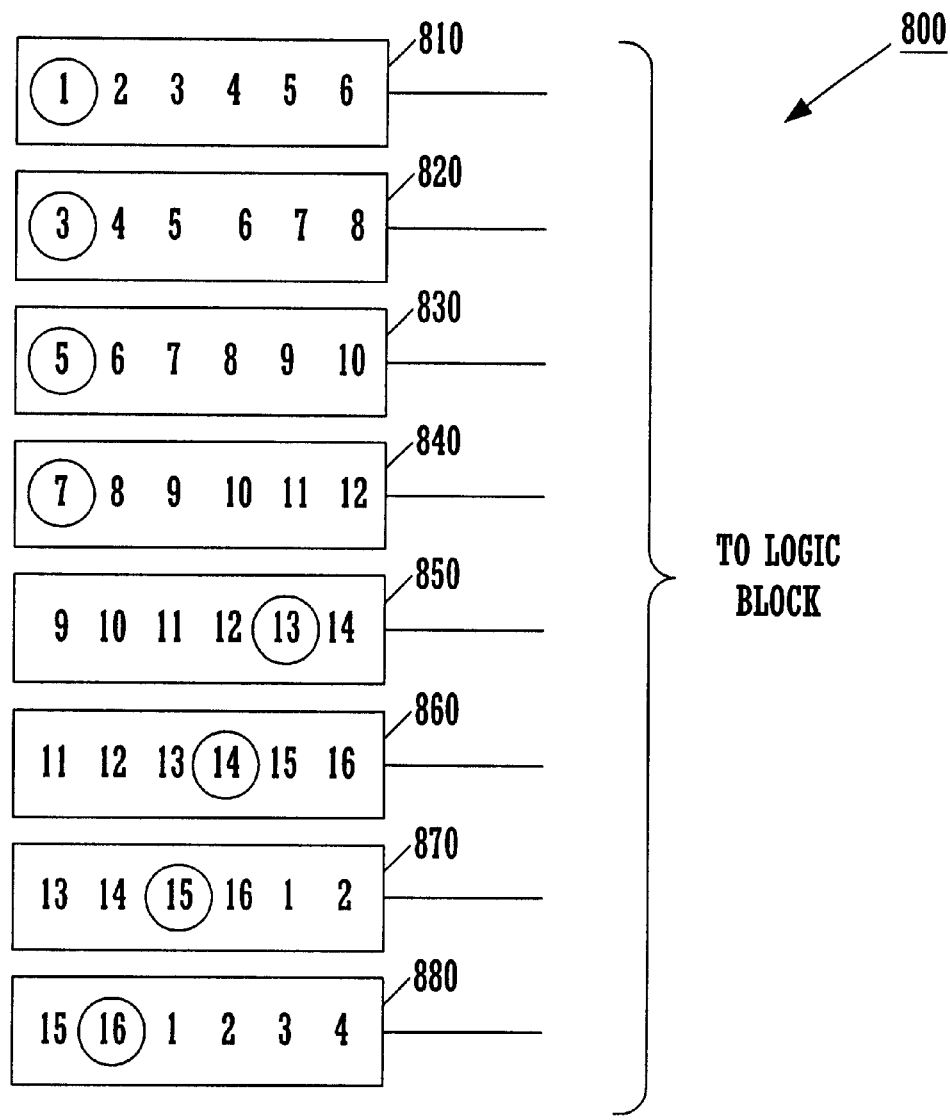
FIG. 21C continues the example of FIG. 21A.

An even more complicated example is shown in FIGS. 21A, 21B, and 21C. The combination of input signals for this example includes input signals 13, 14, 15, 1, 5, 2, 7, and 16. As shown in FIG. 20A, input signals 13, 14, 15, 1, 5, 3, and 7 are sequentially routed to multiplexors 850, 860, 870, 810, 820, 880, and 830. respectively. Again, input signal 16 is blocked.

FIG. 21B shows that the first level of qualified input signals include input signals 14, 15, and 3. There are no multiplexors available to reroute these capturing signals at this level. The competing signals of the second level of qualified signals are shown as including input signals 13, 14, 15, 1, 3, and 5. Each competing signal is indicated as competing with the appropriate capturing signal of the first level of qualified input signals. The available multiplexor 840 cannot reroute any of the qualified input signals of the second level.

The qualified input signals of the third level include input signals 13, 14, 15, 1, 5, and 7. Only input signal 7 is shown, however, as none of the other input signals can be routed, as discovered by the previous level. As may be seen from FIG. 21A, multiplexor 840 can reroute input signal 7. Input signal 7 is rerouted to multiplexor 840, competing input signal 5 is rerouted to multiplexor 830, capturing input signal 3 is rerouted to multiplexor 820, and blocked input signal 16 is routed to freed multiplexor 880. The desired combination of input signals is thus successfully routed.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. An interconnect matrix, comprising:
   a plurality of input conductors;
   a plurality of output conductors; and
   a plurality of multiplexors, each independently having (i) a plurality of inputs, each coupled to one of said input conductors, and (ii) an output coupled to at least one of said output conductors; wherein the number of input conductors is greater than the number of inputs at any individual multiplexor, and the number of multiplexors that couple the number of input conductors to the number of output conductors is less than or equal to the number of output conductors.

2. A programmable logic architecture, comprising:
   the interconnect matrix of claim 1, and
   a plurality of logic blocks each coupled to a subset of said output conductors.

3. The programmable logic architecture of claim 2, further comprising a plurality of input macrocells coupled to at least one of said interconnect matrix and said logic blocks.

4. The programmable logic architecture of claim 2, further comprising a plurality of pins coupled to at least one of said interconnect matrix and said logic blocks, said pins providing at least one of (i) an input to one or more of said input conductors and (ii) an output from at least one of said output conductors and said logic blocks.

5. The programmable logic architecture of claim 2, further comprising a plurality of clock inputs coupled to at least one of said interconnect matrix and said logic blocks.

6. The programmable logic architecture of claim 2, wherein said interconnect matrix comprises a plurality $n_{mux}$ of multiplexors, each independently having (i) a number $w_{mux}$ of said inputs for coupling to one or more of a plurality $n_{in}$ of said input conductors, and (ii) an output for coupling to one or more of a plurality $n_{out}$ of said output conductors; wherein $n_{in}$ is greater than $n_{out}$, and each of at least a subset r of said plurality of multiplexors are, with at least one other multiplexor, commonly coupled to a subset q of said plurality of input conductors, wherein r equals $(n_{mux})(wmux)/(nin)$.

7. The programmable logic architecture of claim 6, wherein q equals $(n_{mux})(wmux)-(nin)/(nmux)$.

8. The programmable logic architecture of claim 6, wherein $w_{mux}$ is less than or equal to $n_{in}-n_{out}+1$.

9. The programmable logic architecture of claim 6, wherein $n_{mux}$ is greater than or equal to $n_{out}$.

10. A medium containing computer-readable instructions, said instructions comprising steps for:
    connecting each of a plurality of input conductors of an interconnect matrix to a plurality of multiplexors of said interconnect matrix such that the number of multiplexors that couple the input conductors to a plurality of output conductors of said interconnect matrix is less than or equal to the number of output conductors, wherein:
    the number of input conductors is greater than the number of output conductors, and
    said plurality of multiplexors each independently have (i) a plurality of inputs, each coupled to one of said input conductors, and (ii) an output coupled to at least one of said output conductors, wherein the number of inputs in each multiplexor is less than the number of input conductors and the number of multiplexors is greater than or equal to the number of output conductors.

11. The medium of claim 10, wherein said instructions further comprise steps for coupling said plurality of input conductors to said plurality of output conductors through at most a number of multiplexors equal to the number of output conductors.

12. The medium of claim 10, wherein:

said plurality of multiplexors comprises $n_{mux}$ multiplexors;

said number of inputs comprises $w_{mux}$ inputs;

said plurality of input conductors comprises $n_{in}$ input conductors; and said instructions further comprise steps for commonly coupling each of at least a subset r of said $n_{mux}$ multiplexors with at least one other multiplexor to a subset q of said $n_{in}$ input conductors such that:

r equals $(n_{mux})(w_{mux})/(n_{in})$;

q equals $(n_{mux})(w_{mux})-(n_{in})/(n_{mux})$.

13. A data signal comprising a waveform file including instructions for designing a programmable interconnect matrix (PIM) architecture by arranging a plurality ($n_{mux}$) of multiplexors, each of width $w_{mux}$, a plurality of input conductors, $n_{in}$, and a plurality of output conductors, $n_{out}$, such that the PIM has an amount of overlap given by $(n_{out})(w_{mux})/n_{in}$ if the PIM is to be fully routable, or by $(n_{mux})(w_{mux})/n_{in}$ if the PIM is to be other than fully routable, and the PIM also has a number of chances to route given by $$\frac{(n_{out})(w_{mux}) - n_{in}}{n_{out}},$$

if the PIM is to be fully routable, or by $$\frac{(n_{mux})(w_{mux}) - n_{in}}{n_{mux}}$$

if the PIM is to be other than fully routable.

14. The data signal of claim 13 wherein the instructions allow for optimizing $n_{mux}$ so that $n_{out}$ and/or $n_{in}$ are is/are integers.

15. The data signal of claim 13 wherein the instructions allow for comprising $w_{mux}=n_{in}-n_{out}+1$ if the PIM is to be fully routable or $w_{mux}=n_{in}-n_{mux+}1$ if the PIM is to be other than fully routable.

16. A data signal comprising a waveform file including instructions for routing input signals through a programmable interconnect matrix (PIM) having a number of multiplexors by sequentially selecting each input signal to be routed through the PIM and determining whether any available multiplexors coupled to an input conductor of the PIM corresponding to a selected input signal exist, and, if so, routing the selected input signal accordingly, otherwise determining whether any previously routed ones of the input signals may be rerouted within the PIM to make available one of the multiplexors coupled to the input conductors, and, if so, rerouting one or more of the previously routed input signals and routing the selected input signal, otherwise not routing the selected input signal.

17. The data signal of claim 16 wherein the instructions provide for rerouting previously routed ones of the input signals in a hierarchical fashion.

18. The data signal of claim 17 wherein the hierarchical fashion comprises a first level at which capturing input signals are checked to determine whether any of the capturing input signals may be rerouted within the PIM, a capturing input signal being a previously routed input signal that utilizes one of the multiplexors coupled to the input conductor associated with the selected input signal.

19. The data signal of claim 18 wherein the hierarchical fashion further comprises a second level at which competing signals are checked to determine whether any of the competing signals may be rerouted within the PIM to provide for rerouting one of the capturing input signals, a competing input signal being a previously routed input signal that utilizes one of the multiplexors coupled to an input conductor associated with at least one of the capturing input signals.

* * * * *